US010291264B2

(12) United States Patent
Zhang et al.

(10) Patent No.: US 10,291,264 B2
(45) Date of Patent: May 14, 2019

(54) SYSTEMS AND METHODS FOR RATE MATCHING WHEN USING GENERAL POLAR CODES

(71) Applicants: Ran Zhang, Kanata (CA); Wuxian Shi, Kanata (CA); Nan Cheng, Kanata (CA); Yiqun Ge, Kanata (CA)

(72) Inventors: Ran Zhang, Kanata (CA); Wuxian Shi, Kanata (CA); Nan Cheng, Kanata (CA); Yiqun Ge, Kanata (CA)

(73) Assignee: HUAWEI TECHNOLOGIES CO., LTD., Shenzhen (CN)

( * ) Notice: Subject to any disclaimer, the term of this patent is extended or adjusted under 35 U.S.C. 154(b) by 0 days.

(21) Appl. No.: 15/607,584

(22) Filed: May 29, 2017

(65) Prior Publication Data
US 2017/0366206 A1 Dec. 21, 2017

Related U.S. Application Data

(60) Provisional application No. 62/351,442, filed on Jun. 17, 2016.

(51) Int. Cl.
H03M 13/00 (2006.01)
H04L 1/00 (2006.01)
H03M 13/13 (2006.01)

(52) U.S. Cl.
CPC ..... *H03M 13/6362* (2013.01); *H03M 13/005* (2013.01); *H03M 13/13* (2013.01); *H04L 1/0068* (2013.01)

(58) Field of Classification Search
CPC ............ H03M 13/6362; H03M 13/005; H04L 1/0068
See application file for complete search history.

(56) References Cited

U.S. PATENT DOCUMENTS

| 6,105,158 | A | 8/2000 | Chen et al. |
| 6,507,927 | B1 | 1/2003 | Kalliojaervi |
| 8,347,186 | B1 | 1/2013 | Arikan |
| 2011/0044399 | A1 | 2/2011 | Dowling et al. |

(Continued)

FOREIGN PATENT DOCUMENTS

| CN | 102916763 A | 2/2013 |
| WO | 2015066925 A1 | 5/2015 |

OTHER PUBLICATIONS

Dong-Min Shin et al.,"Mapping Selection and Code Construction for 2m-ary Polar-Coded Modulation",IEEE Communications Letters, vol. 16, No. 6, Jun. 2012,total 4 pages.

(Continued)

Primary Examiner — Kyle Vallecillo

(57) ABSTRACT

General polar codes are disclosed that encode symbols of a q-ary alphabet, where q≥2. Systems and methods are also disclosed for performing code rate matching when using general polar codes. In one embodiment, a method performed at a transmitter includes receiving a plurality of bits at a polar encoder. The plurality of bits represent a plurality of q-ary symbols, where q>2. The method further includes encoding the plurality of bits using the polar encoder to generate a codeword of q-ary symbols represented by bits. The method further includes puncturing the codeword according to a puncturing pattern to obtain a punctured codeword having a reduced bit length.

12 Claims, 22 Drawing Sheets

(56) References Cited

U.S. PATENT DOCUMENTS

| | | | |
|---|---|---|---|
| 2012/0054576 A1 | 3/2012 | Gross et al. | |
| 2014/0108748 A1* | 4/2014 | Lee | H03M 13/1111 711/154 |
| 2015/0077277 A1* | 3/2015 | Alhussien | H03M 13/618 341/67 |
| 2015/0236715 A1* | 8/2015 | Alhussien | H03M 7/40 341/67 |
| 2015/0295593 A1* | 10/2015 | Trifonov | H03M 13/3746 714/776 |
| 2015/0333769 A1 | 11/2015 | Jeong et al. | |
| 2016/0013810 A1 | 1/2016 | Gross et al. | |
| 2016/0254876 A1 | 9/2016 | Shen et al. | |
| 2017/0244429 A1* | 8/2017 | Hof | H03M 13/2924 |
| 2017/0331590 A1* | 11/2017 | Wu | H04L 1/0058 |

OTHER PUBLICATIONS

3GPP TSG RAN WG1 #84bis R1-162229,"Discussion on channel coding and modulation for new radio interface", ZTE, Apr. 11-15, 2016,total 8 pages.

3GPP TSG RAN WG1 Meeting #xx R1-164039,"Polar codes—encoding and decoding",Huawei, HiSilicon,May 23-27, 2016,total 7 pages.

E. Arikan, "Channel Polarization: A Method for Constructing Capacity-Achieving Codes for Symmetric Binary-Input Memoryless Channels" IEEE Transactions on Information Theory, vol. 55, No. 7, 23 pages, published in Jul. 2009.

Liang Zhang et al. "On the Puncturing Patterns for Punctured Polar Codes", IEEE Symposium on Information Theory, 5 pages, published in 2014.

Runxin Wang et al. A Novel Puncturing Scheme for Polar Codes, IEEE Communications Letters, vol. 18, No. 12, 4 pages, published in Dec. 2014.

Dong-Min Shin et.al., "Design of Length-Compatible Polar Codes Based on the Reduction of Polarizing Matrices", IEEE Transactions on Communications, vol. 61, No. 7, 7 pages, published in Jul. 2013.

Chen Kai et.al, "Beyond Turbo Codes: Rate-Compatible Punctured Polar Codes", IEEE ICC 2013, 5 pages, published in 2013.

Vera Miloslavskaya, "Shortened Polar Codes", IEEE Transactions on Information Theory., vol. 61, No. 9, 14 pages, published in Sep. 2015.

R. Mori et al., "Non-Binary Polar Codes using Reed-Solomon Codes and Algebraic Geometry Codes," 2010 IEEE Information Theory Workshop, 5 pages, published on Jul. 21, 2010.

R. Mori et al., "Channel Polarization on q-ary Discrete Memoryless Channels by Arbitrary Kernels", Information Theory Proceedings (ISIT), 2010 IEEE International Symposium, 5 pages, published on Jul. 21, 2010.

N. Presman et al., "Recursive Descriptions of Polar Codes," Advances in Mathematics of Communications, 60 pages, published on Jun. 18, 2015.

N. Presman et al., "Polar Codes with Mixed-Kernels", Information Theory Proceedings (ISIT), 2011 IEEE International Symposium, 29 pages, published on Mar. 24, 2015.

3GPP TSG RAN WG1 Meeting #84bis R1-162161, "Overview of Polar Codes,"Huawei, HiSilicon, Apr. 11th-15th, 2016, total 7 pages. XP051080007.

Ali Eslami et al. A Practical Approach to Polar Codes, arXiv.org. Jul. 26, 2011. 5 pages. XP080517802.

Kai Chen et al. Practical polar code construction over parallel channels, IET Commun., 2013, vol. 7, Iss. 7, pp. 620-627. XP006045257.

Bin Li et al. polar codes for 5G, Aug. 31, 2015. 37 pages. XP55569574.

* cited by examiner $$G_2 = \begin{bmatrix} 1 & 0 \\ 1 & 1 \end{bmatrix} \quad G_2^{\otimes 2} = \begin{bmatrix} G_2 & 0 \\ G_2 & G_2 \end{bmatrix}$$

$$G_2^{\otimes 2} = \begin{bmatrix} 1 & 0 & 0 & 0 \\ 1 & 1 & 0 & 0 \\ 1 & 0 & 1 & 0 \\ 1 & 1 & 1 & 1 \end{bmatrix}$$

$$G_2^{\otimes 3} = \begin{bmatrix} G_2 & 0 & 0 & 0 \\ G_2 & G_2 & 0 & 0 \\ G_2 & 0 & G_2 & 0 \\ G_2 & G_2 & G_2 & G_2 \end{bmatrix}$$

$$G_2^{\otimes 3} = \begin{bmatrix} 1 & 0 & 0 & 0 & 0 & 0 & 0 & 0 \\ 1 & 1 & 0 & 0 & 0 & 0 & 0 & 0 \\ 1 & 0 & 1 & 0 & 0 & 0 & 0 & 0 \\ 1 & 1 & 1 & 1 & 0 & 0 & 0 & 0 \\ 1 & 0 & 0 & 0 & 1 & 0 & 0 & 0 \\ 1 & 1 & 0 & 0 & 1 & 1 & 0 & 0 \\ 1 & 0 & 1 & 0 & 1 & 0 & 1 & 0 \\ 1 & 1 & 1 & 1 & 1 & 1 & 1 & 1 \end{bmatrix}$$

FIG. 2

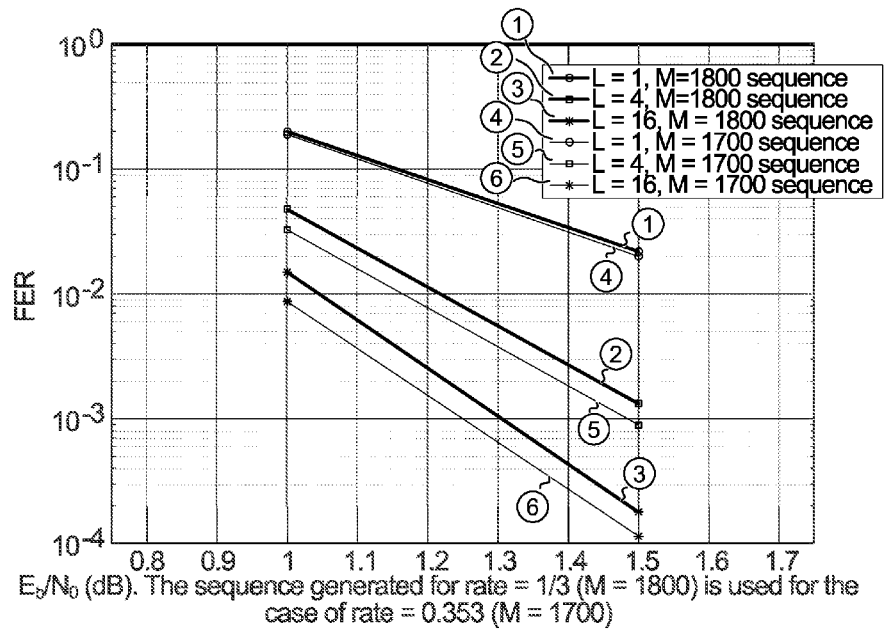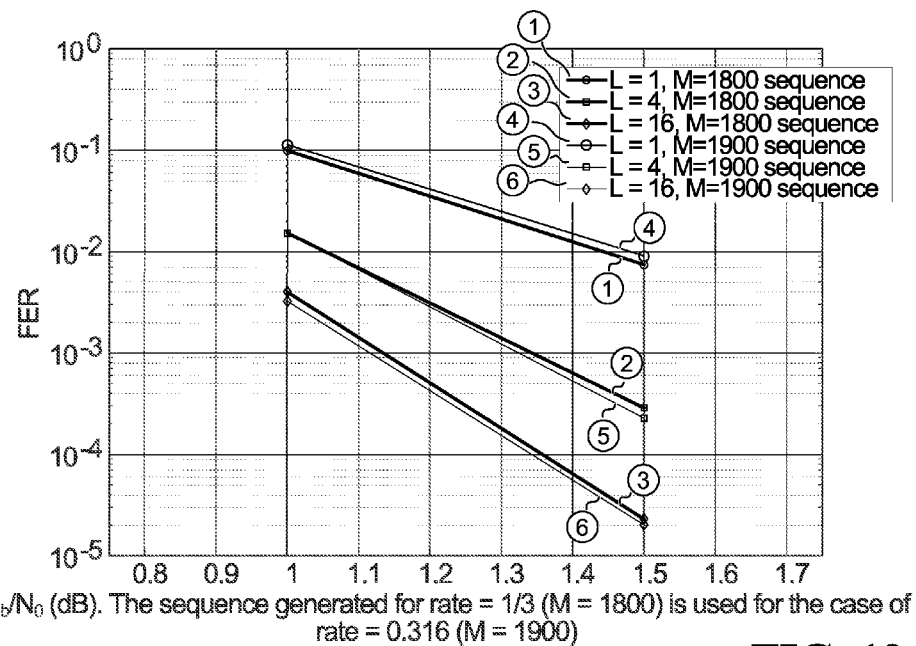
FIG. 19

US 10,291,264 B2

SYSTEMS AND METHODS FOR RATE MATCHING WHEN USING GENERAL POLAR CODES

PRIORITY CLAIM

The present application claims priority to U.S. Provisional Patent Application Ser. No. 62/351,442, titled "Systems and Methods for Rate Matching When Using General Polar Codes", filed Jun. 17, 2016, and incorporated herein by reference.

FIELD

The present application relates to error control coding and coding rate matching, and more particularly to coding rate matching when using general polar codes.

BACKGROUND

In a communication system, information is transmitted from a transmitter, over a channel, to a receiver. For example, in a wireless communication system, a transmitter in a mobile device may transmit information over a wireless channel to a receiver in a base station.

The channel may introduce errors into the information transmitted over the channel. Error control coding may be used to detect and/or correct the errors. For example, k bits of information to be transmitted from a transmitter to a receiver may first be encoded by an encoder in the transmitter to obtain a codeword having a length of $N_b$ bits, where $N_b>k$. The codeword may then be transmitted over the channel. The received codeword is then decoded by a decoder in the receiver to obtain a decision as to which k bits were transmitted. The redundancy added by transmitting a codeword of bit length $N_b>k$ increases the probability that the k bits are correctly decoded at the receiver, even if some errors were introduced into the codeword by the noise in the channel.

There are different types of error detecting and correcting codes. One type of error correcting code, referred to as an Arikan polar code, is disclosed in the paper "Channel Polarization: A Method for Constructing Capacity-Achieving Codes for Symmetric Binary-Input Memoryless Channels" by E. Arikan, *IEEE Transactions on Information Theory*, vol. 55, no. 7 (July 2009). The Arikan polar code is a binary polar code, which means that the Arikan polar code only performs error control coding on a binary symbol alphabet. The k bits that are encoded using the Arkian polar code represent k information symbols. Each one of the k information symbols can only take on one of two values.

Also, the bit length $N_b$ of each codeword in the Arikan polar code must be a power of two, i.e. $N_b=2^n$, where n is a natural number. However, due to the coding rate requirement, the codeword length that can be actually transmitted into the channel may not be exactly the bit length $N_b=2^i$.

SUMMARY

General polar codes are disclosed that encode symbols of a q-ary alphabet, where $q \geq 2$. Systems and methods are disclosed for performing code rate matching when using general polar codes.

In one embodiment, a method performed at a transmitter includes receiving a plurality of bits at a polar encoder. The plurality of bits represent a plurality of q-ary symbols, where $q>2$. The method further includes encoding the plurality of bits using the polar encoder to generate a codeword of q-ary symbols represented by bits. The method further includes puncturing the codeword according to a puncturing pattern to obtain a punctured codeword having a reduced bit length.

In the preceding embodiment, encoding the plurality of bits may include encoding the plurality of bits using at least one polar encoder kernel to generate the codeword.

In any one of the preceding embodiments, the encoding may include: receiving, at the polar encoder kernel, a set of input q-ary symbols represented by bits; and transforming the set of input q-ary symbols, according to a seed matrix of the polar encoder kernel, to produce a set of output q-ary symbols represented by bits.

In any one of the preceding embodiments, the encoding the plurality of bits may include mapping the plurality of q-ary symbols to a subset of positions of an input vector according to an information sequence. In some embodiments, the remaining positions of the input vector may be set as frozen values that may be known by a decoder. In some embodiments, the input vector may be encoded in the polar encoder.

In any one of the preceding embodiments, the puncturing pattern may be determined based on the information sequence, or the information sequence may be determined based on the puncturing pattern, or the information sequence and the puncturing pattern may be jointly generated.

In any one of the preceding embodiments, the information sequence may be obtained by: obtaining a value corresponding to at least one of a coding rate R to be used to transmit the plurality of bits, and a length M of the punctured codeword; determining which range of values the value falls within; and obtaining an information sequence corresponding to the range the value falls within. Obtaining the information sequence corresponding to the range the value falls within may include retrieving from memory a stored information sequence corresponding to the range. The information sequence corresponding to the range may be an information sequence determined based on a representative value in the range.

In any one of the preceding embodiments, the codeword may have bit length $N_b$, the punctured codeword may have bit length M, and the puncturing pattern may puncture the first ($N_b-M$) bits of the codeword (other puncturing patterns are contemplated instead and described in more detail later).

In any one of the preceding embodiments, puncturing the codeword according to the puncturing pattern may include shortening the codeword.

In another embodiment, there is provided a transmitter. The transmitter may include a polar encoder to receive a plurality of bits. The plurality of bits may represent a plurality of q-ary symbols, where $q>2$. The transmitter may be configured to encode the plurality of bits to generate a codeword of q-ary symbols represented by bits. The transmitter may further include a puncturer to puncture the codeword according to a puncturing pattern to obtain a punctured codeword having a reduced bit length.

In the preceding embodiment, the polar encoder may be configured to encode the plurality of bits using at least one polar encoder kernel to generate the codeword. The polar encoder may be configured to encode the plurality of bits by: receiving, at the polar encoder kernel, a set of input q-ary symbols represented by bits; and transforming the set of input q-ary symbols, according to a seed matrix of the polar encoder kernel, to produce a set of output q-ary symbols represented by bits.

In any one of the preceding embodiments, the polar encoder may be configured to encode the plurality of bits by:

mapping the plurality of q-ary symbols to a subset of positions of an input vector according to an information sequence. The polar encoder may be further configured to set remaining positions of the input vector as frozen values that are known by a decoder. The polar encoder may be further configured to encode the input vector.

In any one of the preceding embodiments, the transmitter may be configured to generate the puncturing pattern based on the information sequence, or the transmitter may be configured to generate the information sequence based on the puncturing pattern, or the transmitter may be configured to jointly generate both the information sequence and the puncturing pattern.

In any one of the preceding embodiments, the transmitter may be configured to obtain the information sequence by: obtaining a value corresponding to at least one of: a coding rate R to be used to transmit the plurality of bits, and a length M of the punctured codeword; determining which range of values the value falls within; and obtaining an information sequence corresponding to the range the value falls within.

In any one of the preceding embodiments, the transmitter may further include a memory. The transmitter may be configured to obtain the information sequence corresponding to the range the value falls within by: retrieving from the memory a stored information sequence corresponding to the range.

In any one of the preceding embodiments, the information sequence corresponding to the range may be an information sequence determined based on a representative value in the range.

In any one of the preceding embodiments, the codeword may have bit length $N_b$, the punctured codeword may have bit length M, and the puncturing pattern may puncture the first $(N_b-M)$ bits of the codeword (other puncturing patterns are contemplated instead and described in more detail later).

In any one of the preceding embodiments, puncturing the codeword according to the puncturing pattern may include shortening the codeword.

BRIEF DESCRIPTION OF THE DRAWINGS

Embodiments will be described, by way of example only, with reference to the accompanying figures wherein:

FIG. 2 shows how a Kronecker product matrix can be produced from the seed matrix $G_2$;

FIGS. 19 to 22 illustrate different FER curves;

DETAILED DESCRIPTION

For illustrative purposes, specific example embodiments will now be explained in greater detail below in conjunction with the figures.

Figure 1:
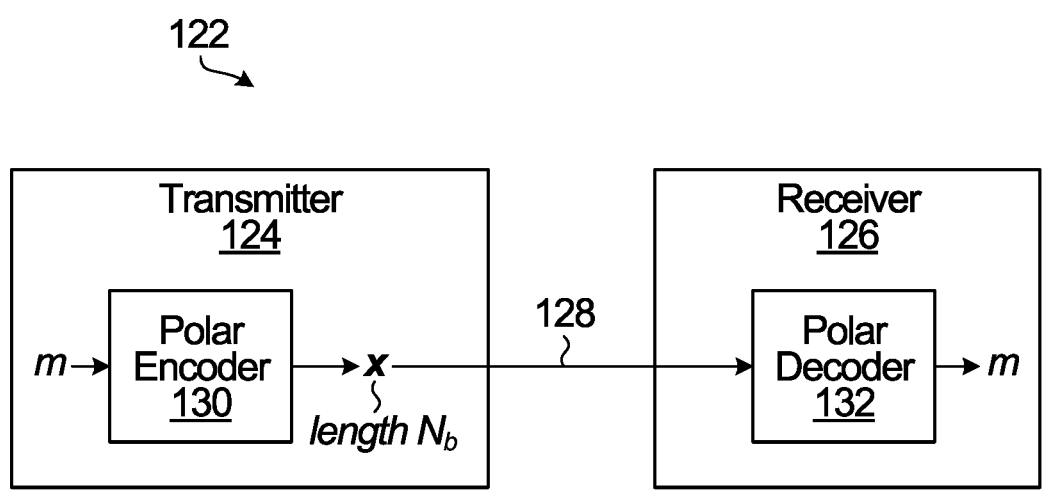
FIG. 1 is a block diagram of a communication system according to one embodiment.

FIG. 1 is a block diagram of a communication system 122 according to one embodiment. The communication system 122 includes a transmitter 124 and a receiver 126 that communicate over a channel 128. The transmitter 124 includes a polar encoder 130 and the receiver 126 includes a polar decoder 132.

The polar encoder 130, as well as other data/signal processing functions of the transmitter 124, e.g. the puncturer described later, may be implemented by a processor that executes instructions to cause the processor to perform some or all of the operations of the polar encoder 130 and transmitter 124. Alternatively, the polar encoder 130, as well as the other data/signal processing functions of the transmitter 124, may be implemented in hardware or circuitry (e.g. in one or more chipsets, microprocessors, application-specific integrated circuits (ASICs), field-programmable gate arrays (FPGAs), dedicated circuitry, or combinations thereof) and configured to implement the operations of the polar encoder 130 and transmitter 124. Although not shown, the transmitter 124 could include a modulator, an amplifier, antenna and/or other modules or components of a transmit chain or alternatively could be configured to interface with a separate (Radio-Frequency—RF) transmission module so that codewords may be produced as described herein and transmitted directly or by a separate transmission unit or module. The transmitter 124 may also include a non-transitory computer readable medium (not shown), that includes instructions for execution (e.g. by a processor or some other circuitry as described above) to implement and/or control operation of the polar encoder 130 and transmitter 124, and/or to otherwise control the execution of functionality and/or embodiments described herein. Some embodiments may be implemented by using hardware only. In some embodiments, the instructions for execution by a processor may be embodied in the form of a software product. The software product may be stored in a non-volatile or non-transitory storage medium or memory, which could be, for example, a compact disc read-only memory (CD-ROM), universal serial bus (USB) flash disk, or a removable hard disk.

Similarly, the polar decoder 132, as well as other data/signal processing functions of the receiver 126, may be implemented by a processor that that executes instructions to cause the processor to perform some or all of the operations of the polar decoder 132 and receiver 126. Alternatively, the polar decoder 132, as well as the other data/signal processing functions of the receiver 126, may be implemented in hardware or circuitry (e.g. in one or more chipsets, microprocessors, ASICs, FPGAs, dedicated circuitry, or combinations thereof) and configured to implement some or all of the operations of the polar decoder 132 and receiver 126. Although not shown, the receiver 126 could include an antenna, demodulator, amplifier, and/or other modules or components of a receive chain or alternatively could be configured to interface with a separate (Radio-Frequency—RF) receiving module to process and/or decode words based on codewords of a polar code received by the receiver 126 directly or indirectly from a separate receiving unit or module. The receiver 126 may also include a non-transitory computer readable medium (not shown), that includes instructions for execution (e.g. by a processor or some other circuitry as described above) to implement and/or control operation of the polar decoder 132 and receiver 126, and/or to otherwise control the execution of functionality and/or embodiments described herein. Some embodiments may be implemented by using hardware only. In some embodiments, the instructions for execution by a processor may be embodied in the form of a software product. The software product may be stored in a non-volatile or non-transitory storage medium or memory, which could be, for example, a CD-ROM, USB flash disk, or a removable hard disk.

In operation, the polar encoder 130 encodes a group of m bits to obtain a corresponding codeword x that has a codeword length equal to $N_b$ bits, where $N_b > m$. Although the polar encoder 130 receives bits, in the polar encoder 130 the bits may represent symbols of a q-ary alphabet. The use of the word "symbols" is not meant to refer to symbols in a modulation constellation, but is meant to refer to elements of a q-ary alphabet. For example, a 4-ary alphabet may have four symbols denoted using the notation "0", "1", "2", and "3", and respectively represented by bits 00, 01, 10, and 11

The codeword x output by the polar encoder 130 is transmitted over the channel 128 and received at the polar decoder 132 of the receiver 126. The polar decoder 132 performs decoding to make a decision as to which group of m bits was transmitted. The decoding is considered successful if the m bits decoded by the polar decoder 132 match the m bits originally transmitted. If the channel 128 is noisy and introduces too many errors into the codeword x, then the polar decoding may not be able to correct all of the errors.

A polar code may be generated using a Kronecker product matrix G that is produced from a seed matrix $G_s$. For a binary polar code, each information symbol is a bit, and a seed matrix $G_s = G_2$ may be used, where $$G_2 = \begin{bmatrix} 1 & 0 \\ 1 & 1 \end{bmatrix}.$$

FIG. 2 shows how a Kronecker product matrix can be produced from the seed matrix $G_2$. Shown in FIG. 2 is a 2-fold Kronecker product matrix $G_2^{\otimes 2}$ 142 and a 3-fold Kronecker product matrix $G_2^{\otimes 3}$ 144. The Kronecker product approach can be iterated to produce an n-fold Kronecker product matrix $G_2^{\otimes n}$. For a binary polar code having codewords of length $N=2^n$, the Kronecker product matrix G is the generator matrix for the polar code, and is equal to $G = G_2^{\otimes n}$.

Figure 3:
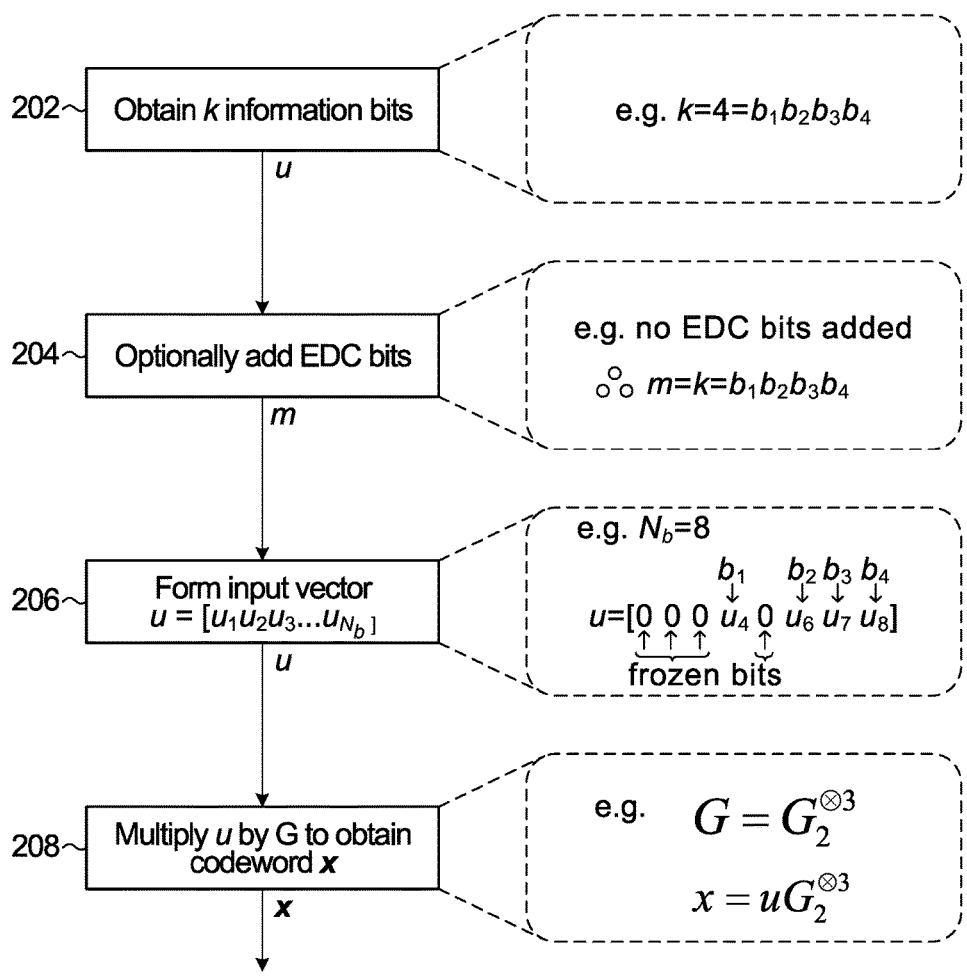
FIG. 3 is a flowchart illustrating how a codeword is generated using a binary polar code, according to one embodiment.

FIG. 3 is a flowchart illustrating how a codeword is generated using a binary polar code, according to one embodiment. One specific example is shown in stippled bubbles for a binary polar code having codewords of bit length $N_b=8$, i.e., a binary polar code having the generator matrix $G = G_2^{\otimes 3}$. In step 202, k information bits that are to be transmitted to the receiver 126 are obtained. In the example, k=4 bits labelled $b_1 b_2 b_3 b_4$. Optionally, in step 204, assistant or error-detecting code (EDC) bits, such as cyclic redundancy check (CRC) bits, are added to the k bits (to result in m information bits) to assist in decoding. It is understood that more than one EDC could be used within one codeword. It should also be understood that other types of EDCs may be used instead or in addition, such as checksum codes, Fletcher codes, hash codes or other parity check codes. Some EDCs may also be used as Error-Correction Codes (ECCs) and may be used in path selection for List decoding, for example, to improve polar code performance.

CRC bits, for example, are generated based on the k information bits and generally placed in more reliable positions in the input vector. However, depending on their intended purpose (e.g. used for error detection or error correction or both), the CRC bits may also or instead be distributed or otherwise placed in other positions in the input vector. In this example, starting with the k information bits, a CRC is calculated and appended to the k information bits to produce the m information bits that includes the k information bits and the CRC bits.

In the example of FIG. 3, no EDC bits are added in step 204, and therefore k=m. The m bits are input into the polar encoder 130. In step 206, the polar encoder 130 forms an input vector $u=[u_1 \ u_2 \ u_3 \ \ldots \ u_{N_b}]$ that is $N_b$ bits long by mapping each one of the m bits to a respective one of the $N_b$ positions in the input vector u, and then by placing "frozen" bits in the remaining positions of the input vector u. The value and position of the frozen bits are known to both the polar encoder 130 and the polar decoder 132. According to the channel polarization theory behind polar code construction, some positions of the input vector u will have a higher reliability of being correctly decoded than other positions of the input vector u. In polar code construction, an attempt is made to put the m bits in the more reliable positions of the input vector u, and to put frozen bits in the more unreliable positions of the input vector u. In the example in FIG. 3, $N_b=8$, and positions $u_4$, $u_6$, $u_7$, and $u_8$ are the more reliable positions of the input vector u. Therefore, the m bits are placed in positions $u_4$, $u_6$, $u_7$, and $u_8$. The frozen bits each have the value zero, although more generally the frozen bits can be set to another value known to both the polar encoder 130 and the polar decoder 132.

In step 208, the input vector u is then multiplied by the generator matrix G to obtain the codeword $x=[x_1 \ x_2 \ x_3 \ \ldots \ x_{N_b}]$. In the example in FIG. 3, $x=uG_2^{\otimes 3}$.

Figure 4:
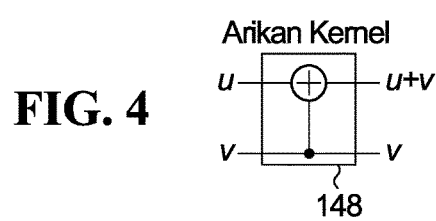
FIG. 4 is a schematic of an Arikan kernel.

The polar encoder 130 may use kernels to implement the multiplication of the input vector u with the generator G, e.g. to implement step 208 of FIG. 3. FIG. 4 is a schematic of a kernel 148 for implementing a multiplication of inputs [u v] by seed matrix $$G_2 = \begin{bmatrix} 1 & 0 \\ 1 & 1 \end{bmatrix}.$$

The seed matrix for a kernel is sometimes instead referred to as a kernel generator matrix. The kernel 148 is a binary kernel, and specifically the Arikan binary kernel. Other types of binary kernels are possible. The Arikan binary kernel 148 receives the two inputs u and v, and outputs u+v and v, which represent the output of the multiplication $$[uv]\begin{bmatrix} 1 & 0 \\ 1 & 1 \end{bmatrix}.$$

The circle plus symbol represents modulo 2 addition.

Figure 5:
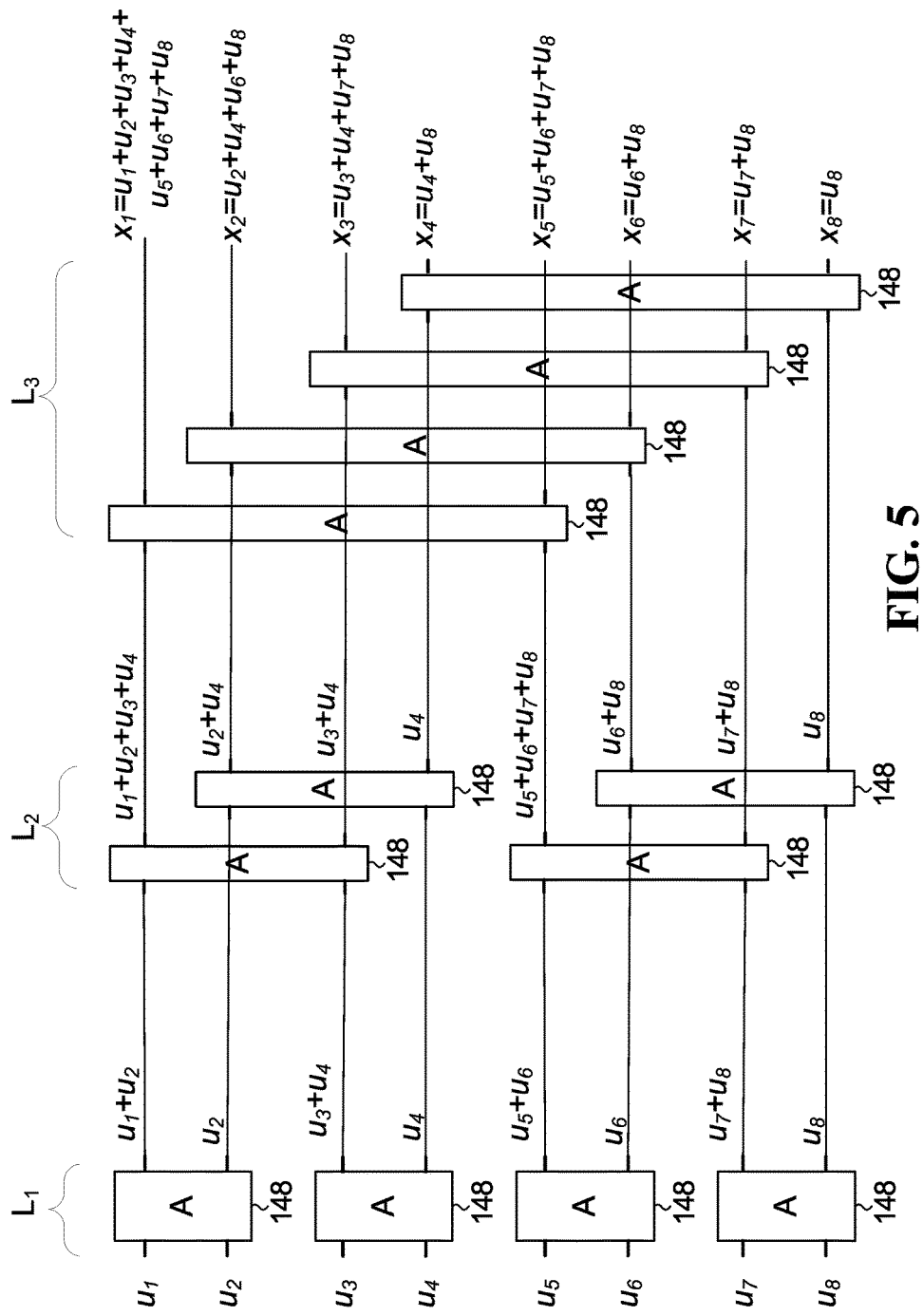
FIGS. 5 and 6 are each a schematic of a structure for implementing the example in step 208 of FIG. 3.

FIG. 5 is a schematic of an example structure for implementing the example in step 208 of FIG. 3, i.e. the matrix multiplication $x=[x_1\ x_2\ x_3\ \ldots\ x_{N_b}]=uG_2^{\otimes 3}$. Each kernel 148 in FIG. 5 is the same as that illustrated in FIG. 4, and is therefore designated using the same reference number 148. Each kernel is also indicated by the letter "A" in FIG. 5 since it is the Arikan binary kernel. Three encoding layers are used, labelled $L_1$, $L_2$, and $L_3$, with each encoding layer having four binary kernels. An encoding layer may also be called an encoding stage.

Figure 6:
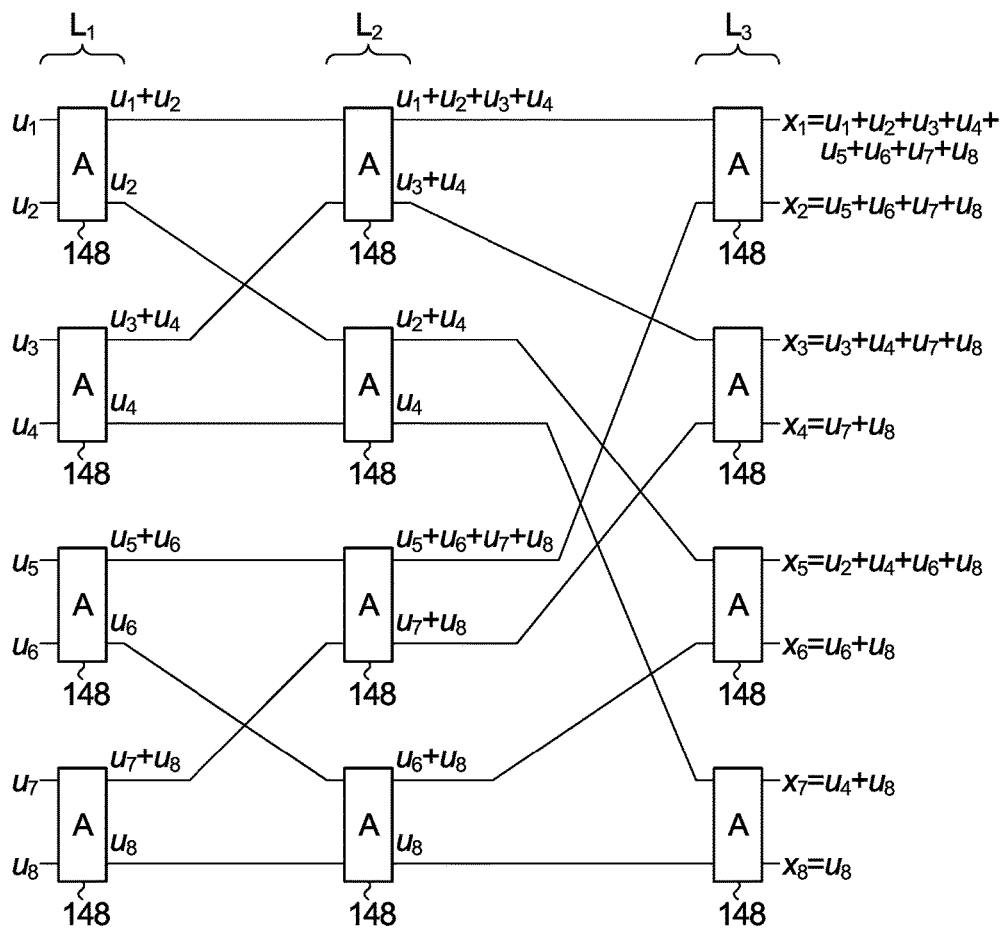

Polar coding may be performed with or without bit reversal. The example structure of FIG. 5 does not have bit reversal. Another example structure for implementing step 208 is shown in FIG. 6. The example in FIG. 6 implements bit reversal. Generally, the output of a polar encoder can be expressed as $x_0^{n-1}=u_0^{N-1}G_N$, where, without bit reversal, $G_N=F^{\otimes n}$ is an N-by-N generator matrix, $N=2^n$, $n\geq 1$. For example, for $n=1$, $G_2=F$. For bit reversal, $G_N=B_N F^{\otimes n}$, where $B_N$ is an N-by-N bit-reversal permutation matrix.

General Polar Code

Figure 7:
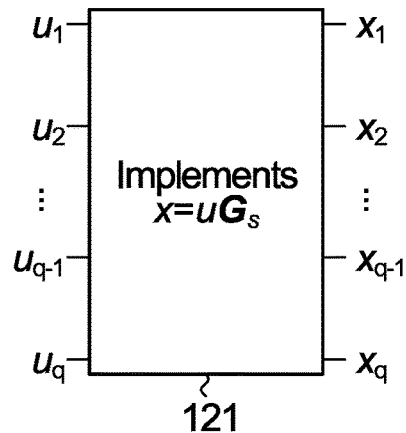
FIG. 7 illustrates an example general kernel.

The binary polar codes described above based on seed matrix $$G_2 = \begin{bmatrix} 1 & 0 \\ 1 & 1 \end{bmatrix}$$

are limited to a binary symbol alphabet. A general polar code may be constructed that encodes symbols of an q-ary alphabet, where $q\geq 2$. An input vector u is encoded using a generator matrix G to result in a codeword x. The input vector u has m information symbols, with each information symbol being represented using $\log_2 q$ information bits. The remaining positions of the input vector u are frozen, i.e. known to both the polar encoder 130 and polar decoder 132. Multiplication of the input vector u with the generator matrix G may be implemented using kernel layers, where each kernel performs finite field operations in a Galois field GF(q) in order to implement multiplication with the seed matrix $G_s$ of the generator matrix G. An example general kernel 121 is illustrated in FIG. 7. The kernel 121 implements the operation $x=uG_s$, where $u=[u_1\ u_2\ \ldots\ u_{q-1}\ u_q]$ and $x=[x_1\ x_2\ \ldots\ x_{q-1}\ x_q]$. Both u and x are vectors of symbols, each symbol represented by $\log_2 q$ bits. A binary kernel is a special case of the general kernel 121 for $q=2$.

Figure 8:
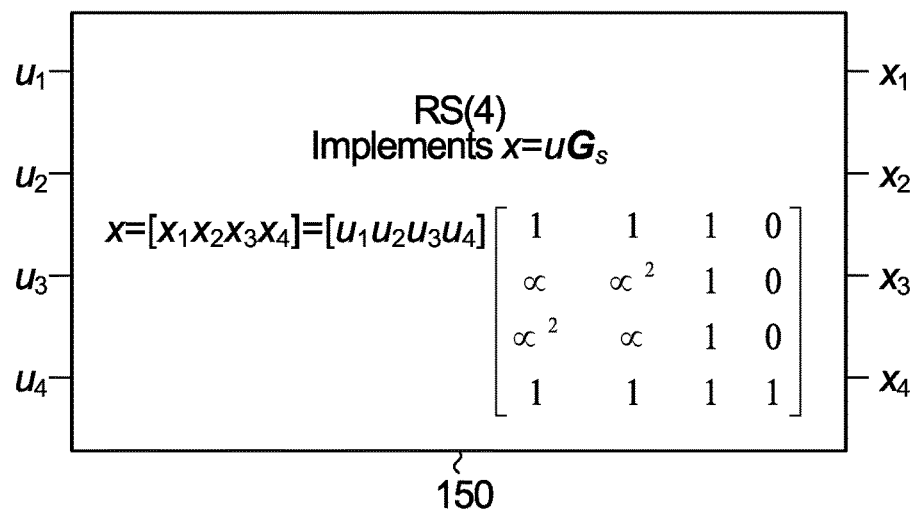
FIG. 8 illustrates a Reed-Solomon (RS) based kernel.

For example, a general polar code may be defined that encodes 4-ary symbols, i.e. $q=4$. Each input symbol is one of four possible values, which are respectively represented using the notation 0, 1, $\alpha$, and $\alpha^2$. Two bits are used in implementation to represent each possible symbol value: 00, 01, 10, and 11. The following is one example of a seed matrix $G_s$ that may be used:

$$G_s = \begin{bmatrix} 1 & 1 & 1 & 0 \\ \alpha & \alpha^2 & 1 & 0 \\ \alpha^2 & \alpha & 1 & 0 \\ 1 & 1 & 1 & 0 \end{bmatrix},$$

where the following finite field operations are defined: $1+\alpha=\alpha^2$, $1+\alpha^2=\alpha$, $1+0=1$, $\alpha+0=\alpha$, $\alpha^2+0=\alpha^2$, $\alpha+\alpha^2=1$, $1+1=0$, $\alpha+\alpha=0$, $\alpha^2+\alpha^2=0$, $0+0=0$, $\alpha\alpha^2=1$, $\alpha 1=\alpha$, $\alpha\alpha=\alpha^2$, $0\times\alpha=0$, $0\times\alpha^2=0$, $0\times 1=0$, $0\times 0=0$, $\alpha^2\times 1=\alpha^2$, $\alpha^2\alpha^2=\alpha$, and $1\times 1=1$. The corresponding kernel will be referred to as a Reed-Solomon (RS) based kernel and is illustrated in FIG. 8 using reference number 150. The notation "RS(4)" is used to indicate that the kernel 150 is an RS based kernel for encoding 4-ary symbols. More generally an "RS(q)" kernel is an RS based kernel for encoding q-ary symbols. An RS based kernel may have performance advantages, some of which will be described below in further detail. Non-binary RS kernels are only one example. Other non-binary kernels may be used, e.g. a Hermitian kernel.

The codeword length for 4-ary symbols is restricted to $N_b=2\times 4^n$ bits, where n is a natural number.

Figure 9:
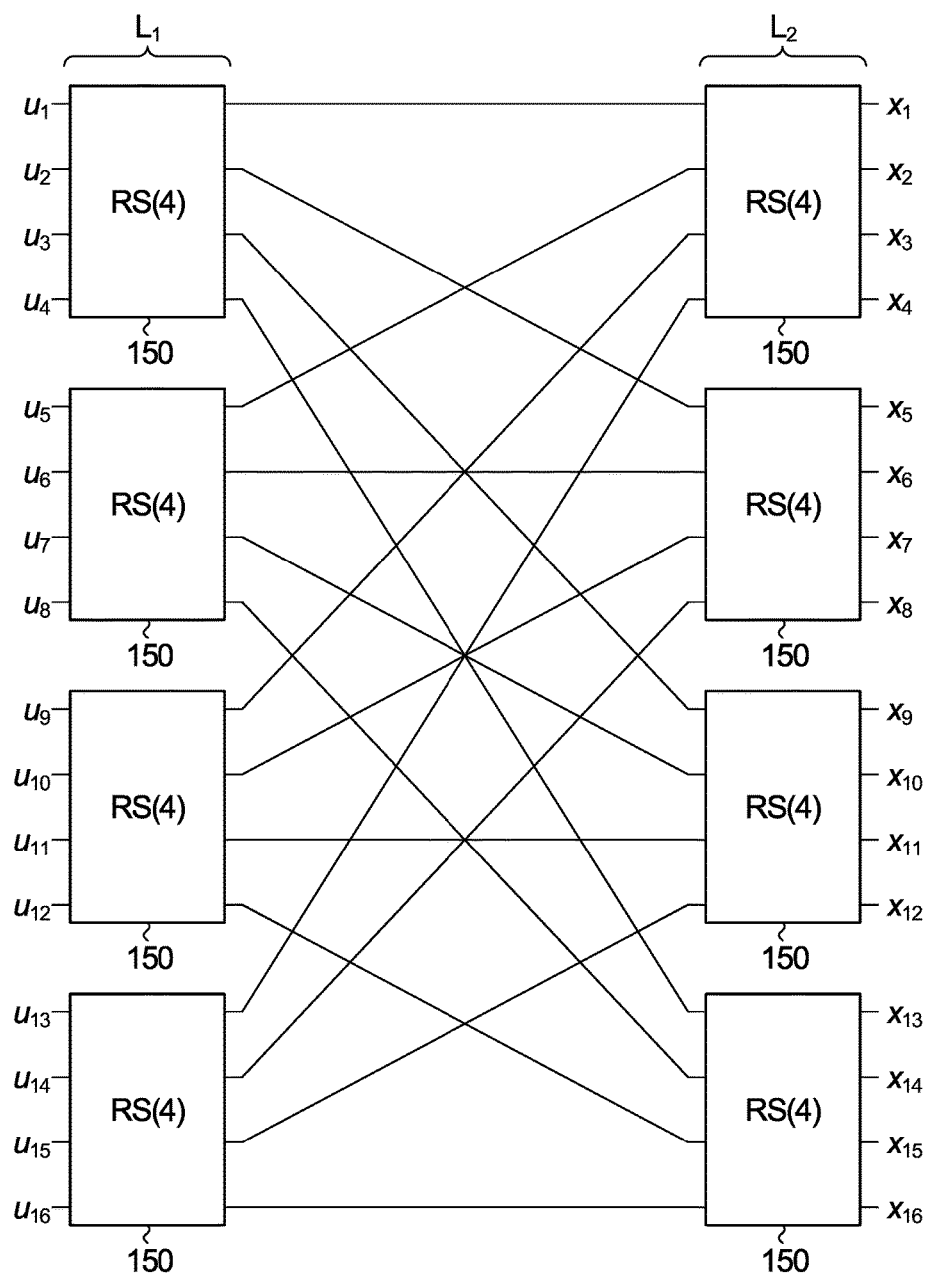
FIGS. 9 and 10 are each a schematic of an RS(4) polar encoder structure for n=2, i.e. 16 symbols.
Figure 10:
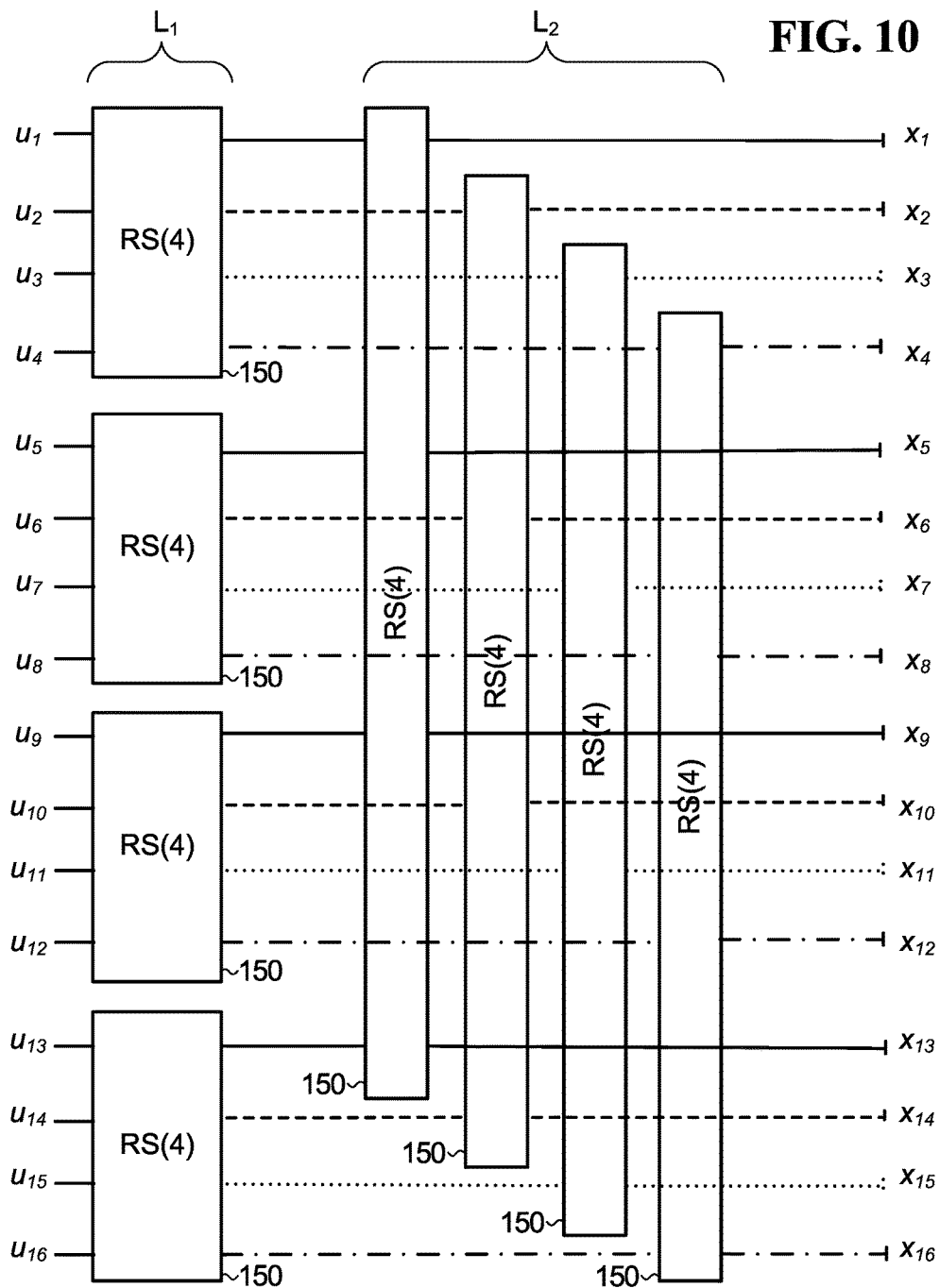

FIG. 9 is a schematic of an RS(4) polar encoder structures for $n=2$, i.e. 16 symbols. The codeword length is $N_b=2\times 16=32$ bits because each 4-ary symbol is represented by 2 bits. Two encoding layers $L_1$ and $L_2$ are used, with each encoding layer having four RS(4) kernels. Each RS(4) kernel accepts four 4-ary symbols, i.e. 8 bits, as an input and produces an output of four 4-ary symbols, i.e. 8 bits. Similar to the polar encoder structure with binary kernel, an RS(4) polar encoder structure can either have symbol index permutation or not. FIG. 9 illustrates the structure with symbol index permutation. FIG. 10 illustrates the structure without symbol index permutation. For the structure with symbol index permutation (FIG. 9), the generator matrix is a permutation matrix times the generator matrix of the encoding structure without symbol index permutation. Embodiments disclosed herein could be implemented with or without symbol index permutation.

For an 8-ary alphabet, a kernel would implement the matrix multiplication $x=uG_s$, where u is an input vector of eight symbols and $G_s$ is an 8×8 seed matrix. Finite field operations in a Galois field GF(8) would be performed. Therefore, the input of the kernel would be eight 8-ary symbols, i.e. 24 bits because three bits are used to represent each input symbol. The output of the kernel would be eight 8-ary symbols, i.e. again 24 bits.

In general, the polar encoder 130 may be constructed to generate a codeword x of length $N_b$ bits by implementing $x=uG$, where x and u both represent a respective vector of n-ary symbols. Each vector x and u has symbol length $N_s=q^n$, which corresponds to a bit length $N_b=\log_2 q\times q^n$. Each of n encoding layers has $q^{n-1}$ kernels, and each kernel has q inputs and q outputs.

The following are possible benefits of using a non-binary general polar code, such as an RS based code. With the same codeword length, a lower frame error rate (FER) for a given list size in the decoder may be achieved, or a smaller list size in the decoder for a given FER may be achieved. Using a smaller list size may reduce implementation complexity and increase the decoding throughput, e.g. by having less list-related memory for copying, moving, and sorting.

Rate/Length Matching

A coding rate R is defined as $R=k_b/N_b$, where $k_b$ is the number of information bits, and $N_b$ is the bit length of the generated codeword corresponding to the $k_b$ information bits. When the transmitter 124 is to transmit $k_b$ bits to the receiver 126, the transmitter 124 may be required to use a particular coding rate R/code length, which may change over time, e.g. based on the available network resources, such as bandwidth.

A polar code places a restriction on the values of $N_b$. For example, when performing polar encoding using only binary kernels, the codeword length in bits, $N_b$, is restricted to a power of two: $N_b=2^n$ bits. The following table summarizes the codeword length $N_b$, and the corresponding number of encoding layers, n, for different values of n, up to n=12:

| | n | | | | | | | | | | | |
|---|---|---|---|---|---|---|---|---|---|---|---|---|
| | 1 | 2 | 3 | 4 | 5 | 6 | 7 | 8 | 9 | 10 | 11 | 12 |
| $N_b$ | 2 | 4 | 8 | 16 | 32 | 64 | 128 | 256 | 512 | 1024 | 2048 | 4096 |

As another example, when performing polar encoding using only RS(4) kernels, the codeword length $N_b$ is restricted to $N_b=2 \times 4^n$ bits. The following table summarizes the codeword length $N_b$, and the corresponding number of encoding layers, n, for different values of n, up to n=7:

| | n | | | | | | |
|---|---|---|---|---|---|---|---|
| | 1 | 2 | 3 | 4 | 5 | 6 | 7 |
| $N_b$ | 8 | 32 | 128 | 512 | 2048 | 8192 | 32768 |

As another example, when performing polar encoding using only RS(8) kernels, the codeword length $N_b$ is restricted to $N_b=3 \times 8^n$ bits. The following table summarizes the codeword length $N_b$, and the corresponding number of encoding layers, n, for different values of n, up to n=6:

| | n | | | | | |
|---|---|---|---|---|---|---|
| | 1 | 2 | 3 | 4 | 5 | 6 |
| $N_b$ | 24 | 192 | 1536 | 12288 | 98304 | 786432 |

If the transmitter 124 is to transmit at a coding rate R, and the transmitter 124 has $k_b$ bits to transmit, then the codeword length, in bits, used by the polar encoder 130 should ideally be $N_b=k_b/R$. However, the restriction on $N_b$ due to using a polar code may not allow for a value of $N_b$ that is exactly equal to $N_b=k_b/R$. For example, when performing polar encoding using only binary kernels, then $N_b$ is limited to a power of two. If the transmitter 124 has $k_b$=700 bits to transmit and the coding rate R the transmitter 124 must use is R=⅓, then ideally $$N_b = \frac{700}{\frac{1}{3}} = 2100 \text{ bits.}$$

However, a codeword length of exactly $N_b$=2100 bits cannot be generated using binary kernels. Therefore, the transmitter 124 performs rate matching by padding (lengthening) or puncturing (shortening) the codeword to have exactly M=2100 bits. Rate matching is therefore performed by length matching, that is, modifying the length of the codeword so that the coding rate is satisfied.

Figure 11:
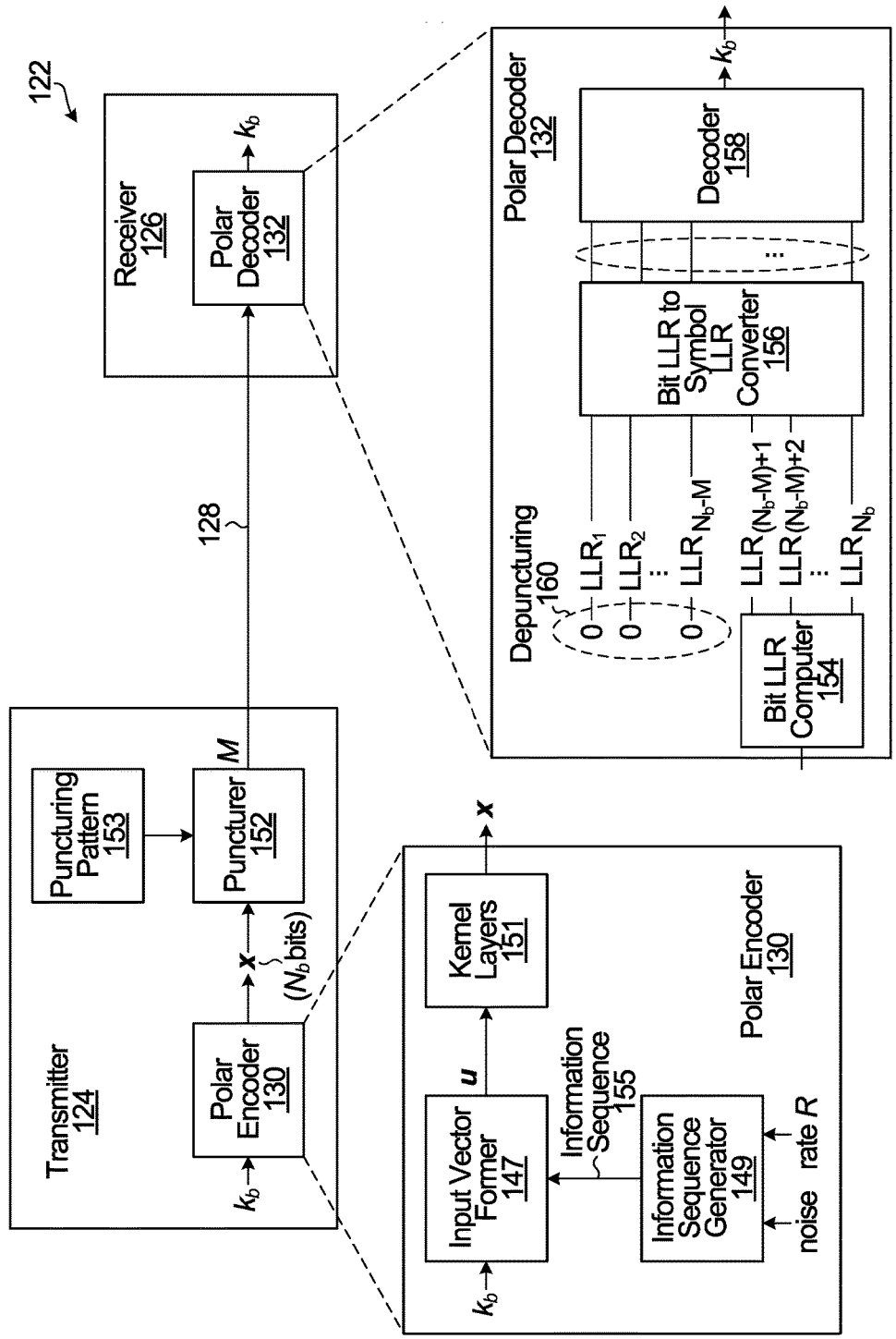
FIG. 11 illustrates a block diagram of a communication system according to another embodiment.

FIG. 11 illustrates the communication system 122 of FIG. 1 according to another embodiment. The transmitter 124 further includes a puncturer 152. The polar encoder 130 specifically includes an input vector former 147, an information sequence generator 149, and one or more kernel layers 151. The transmitter 124 may also include a non-transitory computer readable medium (not shown), that includes instructions for execution (e.g. by a processor or some other circuitry as described above) to implement and/or control operation of the polar encoder 130, and/or the puncturer 152, and/or the transmitter 124, and/or to otherwise control the execution of functionality and/or embodiments described herein. Some embodiments may be implemented by using hardware only. In some embodiments, the instructions for execution by a processor may be embodied in the form of a software product. The software product may be stored in a non-volatile or non-transitory storage medium or memory, which could be, for example, a CD-ROM, USB flash disk, or a removable hard disk.

The polar decoder 132 in the receiver 126 specifically includes a bit log-likelihood ratio (LLR) computer 154, a bit LLR to symbol LLR converter 156, and a decoder 158. The receiver 126 may also include a non-transitory computer readable medium (not shown), that includes instructions for execution (e.g. by a processor or some other circuitry as described above) to implement and/or control operation of the polar decoder 132 and receiver 126, and/or to otherwise control the execution of functionality and/or embodiments described herein. Some embodiments may be implemented by using hardware only. In some embodiments, the instructions for execution by a processor may be embodied in the form of a software product. The software product may be stored in a non-volatile or non-transitory storage medium or memory, which could be, for example, a CD-ROM, USB flash disk, or a removable hard disk.

FIG. 11 would or may include other components not illustrated, such as a modulator in the transmitter 124 and a demodulator in the receiver 126. Modulation and corresponding demodulation may be used to enable computing LLRs. Additional components in the transmitter 124 may also include an amplifier, antenna and/or other modules or components of a transmit chain or alternatively the transmitter 124 could be configured to interface with a separate (RF) transmission module so that codewords may be produced as described herein and transmitted directly or by a separate transmission unit or module. Additional components in the receiver 126 may include an antenna, amplifier, and/or other modules or components of a receive chain or alternatively could be configured to interface with a separate (RF) receiving module to process and/or decode words based on codewords of a polar code received by the receiver 126 directly or indirectly from a separate receiving unit or module.

In operation, $k_b$ bits are received at the polar encoder 130. The input vector former 147 maps the $k_b$ bits to certain positions of an input vector u. The remaining positions of the input vector u are set as frozen positions. An information sequence 155 indicates which positions of the input vector u are to receive each of the $k_b$ bits and which positions of the input vector u are to receive frozen values. The information sequence 155 is generated by the information sequence generator 149 (either generated on-line or read from memory) based on factors such as the coding rate R the transmitter 124 is to use to transmit the $k_b$ bits, and the noise of the channel 128 or a predefined working SNR that is based on the coding rate and coding length. The information sequence generator 149 generates the information sequence 155 such that an attempt is made to put the $k_b$ bits in the more reliable positions of the input vector u and the frozen values in the less reliable positions of the input vector u.

As is known, an ordered sequence such as the information sequence 155 is representative of the relative "reliability" of the sub-channels, where a sub-channel refers to a synthesized channel after the polarization process. In other words, some sub-channels have high capacity, and some sub-channels have low capacity. Put another way, some sub-channels have high Signal-to-Noise Ratio (SNR) and others have low SNR. These metrics are examples of characteristics that could be used to quantify or classify sub-channel "reliability". Other metrics indicative of sub-channel reliability can also be used. Sub-channel selection is based on reliabilities of the sub-channels, and typically the highest reliability sub-channels are selected as information sub-channels for carrying information bits.

For general polar codes, the information sequence 155 could be either a sequence of symbol positions or a sequence of bit positions. For a codeword of $N_b$ bits using q-ary kernels, the full length of a sequence of symbol positions is $N_b/\log_2(q)$; while that of a sequence of bit positions is $N_b$. Take RS(4) polar codes as an example. For a sequence of symbol positions, the positions for putting the information bits are selected in terms of symbols, that is, the neighboring 2 bits representing one symbol to be encoded should be either both information bits or both frozen bits; while for a sequence of bit positions, the neighboring two bits representing one symbol can accommodate zero, one, or two information bits. In some embodiments, using a sequence of symbol positions may have a better error correction performance than using a sequence of bit positions, at least under Genie-aided sequence generation methods. This is attributed to that using a sequence of symbol positions may better exploit the polarization gains when symbol-based kernels are used. A sequence of symbol positions is actually a special case of a sequence of bit positions, in the sense that a sequence of symbol positions is equivalent to a sequence of bit positions with a constraint that the neighboring two bit positions $2*i$ and $2*i+1$ ($0 \le i < N_b/2$) should be either both information bit positions or frozen bit positions. Therefore, for the sake of generality, the information sequence in the following texts refers all to the sequence of bit positions.

A single, nested, SNR-independent ordered sequence 155 of sub-channels could be computed for a code length $N_{max}$, with ordered sequences for shorter code lengths N being selected from the longer $N_{max}$ sequence. Multiple ordered sequences in terms of different mother code lengths $N_i$ could instead be computed, and one of the mother code length sequences could be selected for a particular code based on preferred code length. Another possible option involves computing multiple ordered sequences in terms of SNR values, for example, and selecting an ordered sequence based on the measured SNR.

The information sequence generator 149 can perform ordered sequence computations in a number of different ways. For example, the computations could be performed online, producing an ordered sequence that can be dynamically adjusted or recomputed based on, for example, observed channel conditions. The computations may alternatively be performed offline (e.g. in advance) to produce pre-computed (and static) ordered sequences that can be stored and retrieved or read from memory during subsequent coding operations. In yet another alternative, the computations may be performed partially online and partially offline.

The input vector u that is output from the input vector former 147 is encoded by the one or more kernel layers 151, each kernel layer having at least one kernel, to result in a corresponding codeword x of length $N_b$ bits. The input vector u should be transformed into a vector of q-ary symbols (denoted as $u_s$) before being operated with the kernel layers, and the codeword x of $N_b$ bits should be transformed from an output vector of q-ary symbols (denoted as $x_s$). The one or more kernel layers 151 implement the operation $x_s = u_s G$. Although $x_s$ and $u_s$ are symbols, they are still represented by bits in the hardware.

The polar encoder 130 implements a polar code in which $N_b$ exceeds the number of bits $M = k_b/R$ that can actually be transmitted based on the coding rate R. The codeword x of length $N_b$ bits is therefore punctured by the puncturer 152 to remove bits, according to a puncturing pattern 153, in order to result in M bits. The M bits are then transmitted over the channel 128. "Puncturing" as used herein refers to removing bits from the codeword. When puncturing is performed, the codeword has its length reduced. The word "shortening" is sometimes used to refer to the specific situation in which each bit removed from the codeword has a value that is known by the decoder, e.g. which may be the case if the bits removed from the codeword are a linear combination of frozen bits. "Puncturing", as used herein, encompasses both "shortening", as well as other implementations in which one, some, or all bits removed from the codeword each have a value that is not known by the decoder. Any pattern that indicates which bit(s) to remove from a codeword is referred to as a puncturing pattern. A puncturing pattern encompasses shortening patterns which shorten a subset of positions of a codeword to a reduced length. Puncturing pattern also encompasses other types of patterns that puncture bits but that are not shortening patterns.

Figure 12:
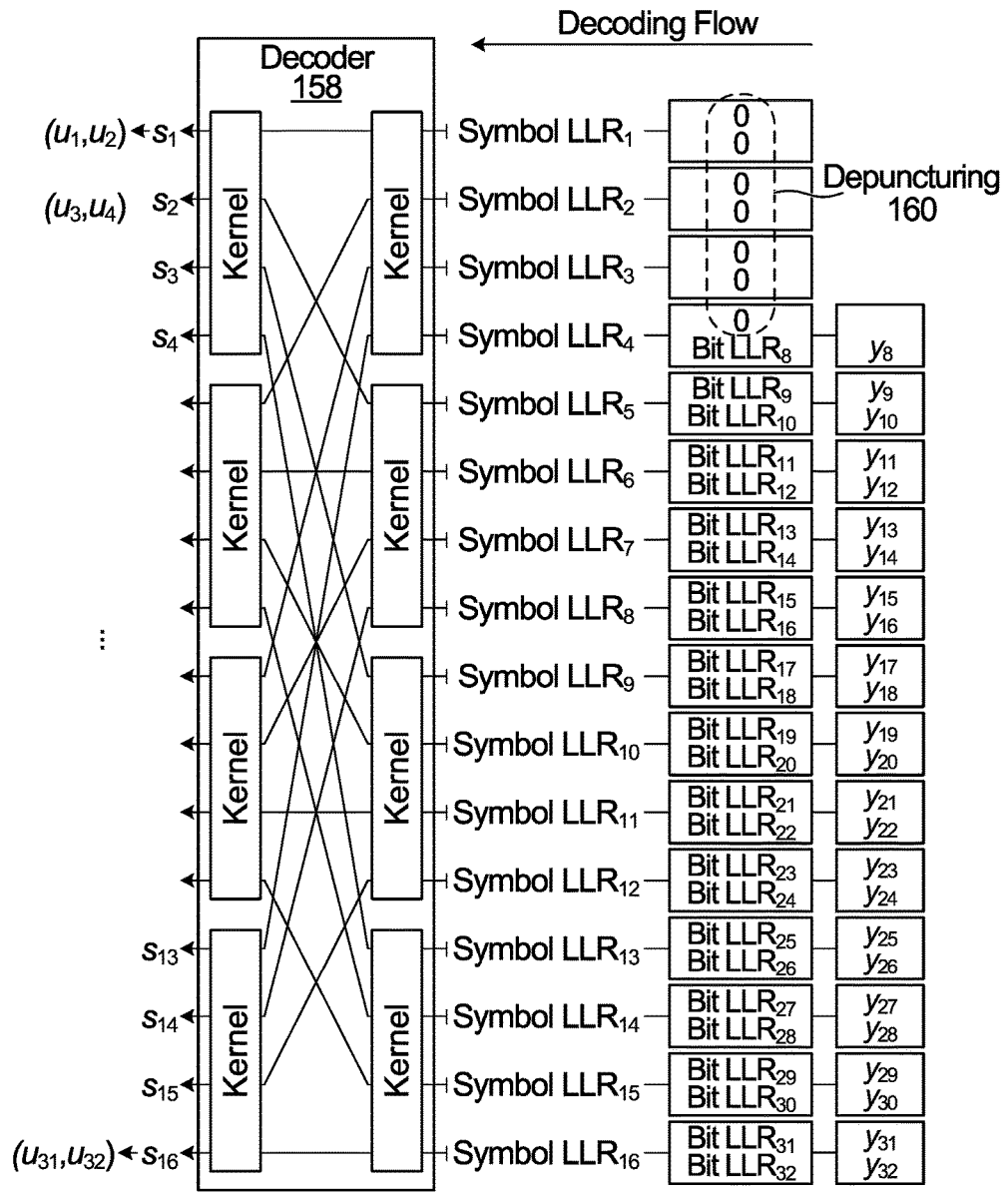
FIGS. 12 and 13 each illustrate one example of a decoder for a 32 bit codeword generated using 2 layers of RS(4) kernels when puncturing is considered.
Figure 13:
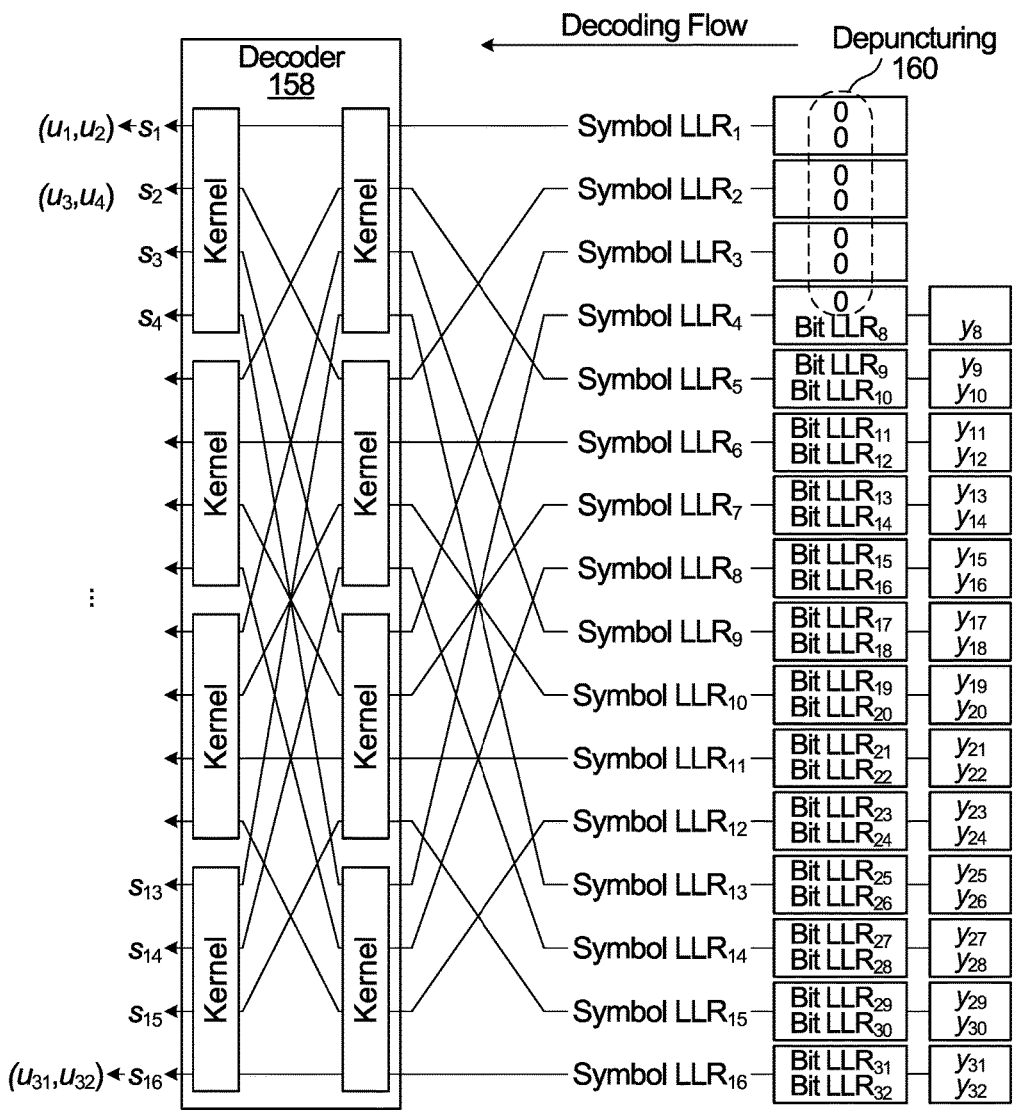

The received signal carrying the M bits is processed at the polar decoder 132. The bit LLR computer 154 first computes the bit LLR for each one of the M bits. Depuncturing is then performed by setting the bit LLR for each one of the punctured bits to zero, as shown at 160. The bit LLR to symbol LLR converter 156 then converts the bit LLRs to corresponding symbol LLRs for the symbols represented by the $N_b$ bits. If the polar encoding 130 only uses binary kernels, then each bit represents a symbol and therefore the each bit LLR is a symbol LLR, and bit LLR to symbol LLR conversion is not required. The symbol LLR values are then processed by the decoder 158 to generate a decision as to which $k_b$ bits were transmitted. An example decoding algorithm implemented by the decoder 158 is symbol-based successive cancellation (SC) or successive cancellation list (SCL) decoding. FIG. 12 illustrates one example of the decoder 158 for a 32 bit codeword generated using 2 layers of RS(4) kernels with symbol index permutation, and where the first 7 bits of the codeword have been punctured. Depuncturing Is performed by setting the bit LLR values to zero for each of 7 punctured bits, as shown at 160. FIG. 13 illustrates another example of decoder 158, where the same puncturing pattern (i.e., puncturing the first 7 bits of the codeword) also applies to the decoder using RS(4) kernel layers, but without symbol index permutation.

Returning to FIG. 11, the puncturing pattern 153 is used to puncture the bits of the codeword x so that the $N_b$ bits of the codeword x are reduced to $M < N_b$ bits. The puncturing pattern 153 indicates which bits should be punctured, i.e. specifically which bits of the codeword x should be removed. When a general polar code is used that encodes symbols of a q-ary alphabet, where q>2, then the puncturing must take into account that fact that groups of bits represent different symbols.

The decision as to which puncturing pattern 153 and information sequence 155 to use is mutually dependent. One approach is to obtain the optimal puncturing pattern 153 given a fixed information sequence 155. For example, first determine the information sequence 155, and then given the frozen positions indicated in the information sequence 155 (i.e. the "frozen set"), generate an optimal puncturing pattern 153. As an example, the information sequence 155 may indicate to place the $k_b$ bits in the last $k_b$ bit positions in the input vector u because the information sequence generator 149 has determined that the last $k_b$ bit positions in the input vector u are the most reliable positions given the noise in the channel and the coding rate R. The puncturing pattern 153 may then be computed based on this specific information sequence 155 in order to try to puncture bits in the codeword x that best correspond to the frozen values.

An alternative method is to first choose the puncturing pattern 153 and then, based on the puncturing pattern 153, generate an optimal information sequence 155. For example, for a given puncturing pattern 153, the frozen set, i.e., the frozen positions in the information sequence 155, may be optimized. The optimal frozen set may be determined using a density evolution method via Gaussian Approximation or Gene-aided methods using simulations. When the optimal frozen set is determined based on the chosen puncturing pattern, then the information sequence generator 149 is modified to not only generate the information sequence 155 based on, for example, the channel noise (or working SNR) and coding rate R, but also generate the information sequence 155 based on the selected puncturing pattern 153. For example, the puncturing pattern 153 may be selected to simply puncture the first $P=N_b-M$ bits of the codeword x. An optimal information sequence 155 is then generated by the information sequence generator 149 in order to determine the frozen positions in the input vector u as the positions that best correspond to the punctured bits in the codeword x.

Alternatively, a joint optimization method may be performed in which the information sequence 155 and the puncturing pattern 153 are generated together in order to jointly optimize the information sequence 155 and the puncturing pattern 153. An exhaustive search or smart reduction of the search space may be performed when doing the joint optimization.

Figure 14:
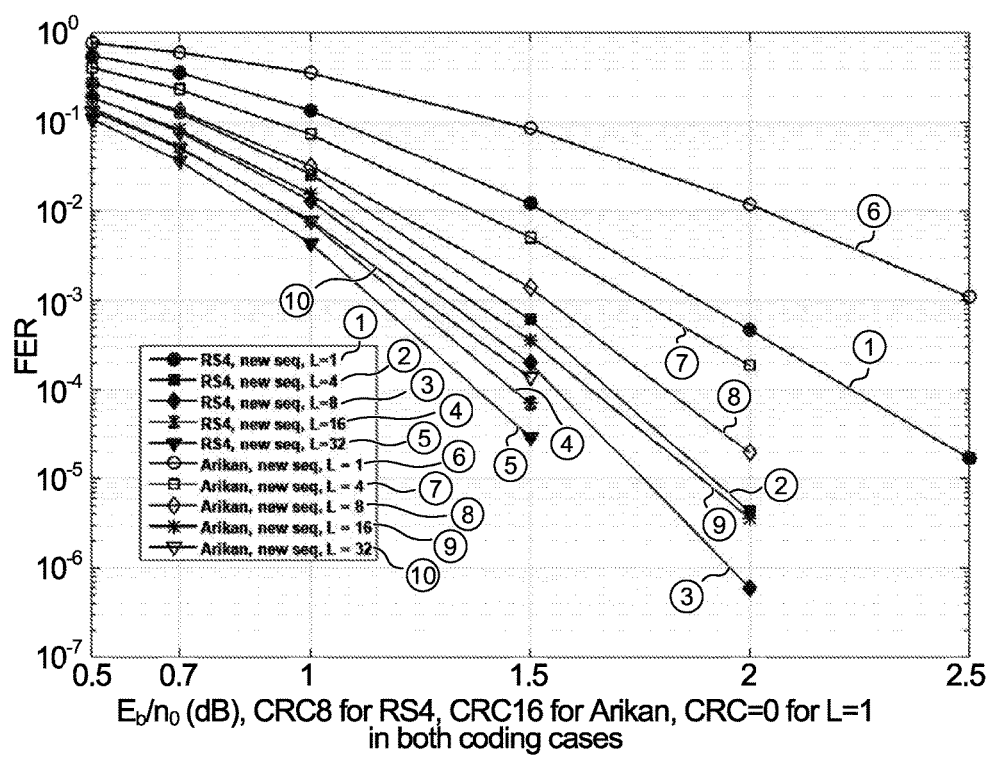
FIG. 14 illustrates frame error rate (FER) curves for CRC-aided polar decoding.

FIG. 14 illustrates FER curves for CRC-aided SCL polar decoding in which $N_b$=2048 bits, $k_b$=600 bits, and R=⅓. Therefore, M=1800 bits, and so 248 bits are punctured. The frozen positions of the information sequence are optimized based on the puncturing pattern. For SC decoding with list size L=1, the performance gain of using RS(4) kernels over Arikan kernels is 0.45 dB at FER=0.1, and 0.5 dB at FER=0.01. For SCL decoding with list size L=8, the performance gain is 0.15 dB at FER=0.1, and 0.17 dB at FER=0.01.

Figure 15:
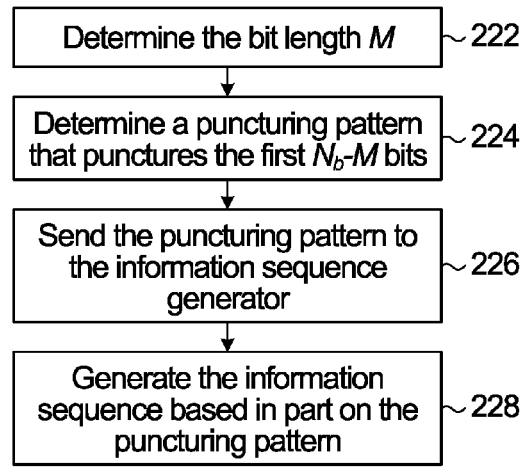
FIG. 15 is a flow chart of a method performed by the transmitter according to one embodiment.

FIG. 15 is a flow chart of an embodiment of a method performed by the transmitter 124, in which the puncturing pattern 153 is first selected and then the information sequence 155 is generated. In step 222, the transmitter 124 determines the bit length M that is to be transmitted over the channel 128. For example, the bit length M may be computed as $M=k_b/R$. In step 224, the transmitter 124 generates or determines the puncturing pattern 153 by constructing a puncturing pattern that punctures the first $P=N_b-M$ bits of the codeword x.

In step 224, puncturing the first $P=N_b-M$ bits is only an example. Another set of $P=N_b-M$ bits may be punctured (e.g. shortened) instead according to another puncturing pattern. The puncturing pattern in step 224 may include the shortening patterns that determine which subset of codeword bits to be shortened to a reduced length. In some embodiments, the puncturing pattern may be generated or determined considering other parameters in addition to M, e.g., the information block length K and/or coding rate R. For instance, for better error correction performance, puncturing the first $N_b-M$ may be adopted for low and medium coding rates R, while block-based shortening or Bit Reversal (BIV) shortening may be used for high coding rates R. In other embodiments, the puncturing pattern 153 may be determined by selecting a puncturing pattern (e.g. based on one or more of the above-noted parameters) from a plurality of available puncturing patterns. In step 226, the transmitter 142 then sends or otherwise makes available the puncturing pattern determined to the information sequence generator 149. Alternatively, the information sequence generator 149 may independently obtain the puncturing pattern 153 determined. In step 228, the information sequence generator 149 generates the information sequence 155 based in part on the puncturing pattern 153.

In some embodiments, step 228 involves computing the information sequence 155 for each codeword x using the puncturing pattern 153 for that codeword x and some or all of the following additional parameters: (i) the length of the input vector u, which is equal to $N_b$ bits; (ii) the number of information bits $k_b$, (iii) the signal-to-noise ratio (SNR) of the channel 128 (or a working SNR), and (iv) the bit length M to be transmitted. For example, a Gaussian approximation for density evolution may be performed to find the optimal frozen positions in the input vector u and thereby generate the information sequence 155. However, performing the computation in step 228 may result in increased computational complexity and increased latency. In particular, when a general polar code is used that encodes symbols of an q-ary alphabet, where q>2, then performing step 228 in an online manner during operation of the transmitter 124 may not be practical. An alternative option is to pre-compute offline and store in the transmitter 124 all information sequences for all possible values of M. However, this may require a large portion of memory to store all of the pre-computed information sequences. Memory constraints on the transmitter 124, such as memory space and/or memory access time, may not allow for storage of all of the pre-computed information sequences.

Figure 16:
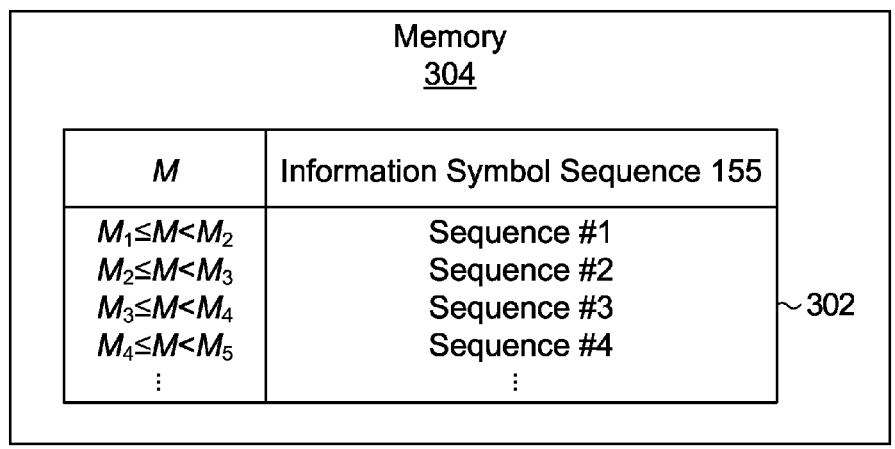
FIG. 16 illustrates a look up table (LUT) stored in memory in the transmitter.

Therefore, in one embodiment, as shown in FIG. 16, a look up table (LUT) 302 is stored in memory 304 in the transmitter 124. The LUT 302 may correspond to a particular puncturing pattern. The LUT 302 indicates which information sequence to use for various ranges of M. For each range, a single information sequence is computed offline for a representative value of M inside the range, and then that information sequence is used for any value of M inside the range. For example, for a range $M_A \leq M < M_B$, a representative block length $M_{Rep}$ is chosen, where $M_A \leq M_{Rep} < M_B$. The information sequence is computed offline for $M_{Rep}$ and stored in the LUT 302. Then, during operation, whenever the value of M is inside the range $M_A \leq M < M_B$, the information sequence stored in the LUT 302 that corresponds to the range $M_A \leq M < M_B$ is used. Specifically, for any value M that is inside the range $M_A \leq M < M_B$, K most reliable bit positions are selected to accommodate the K information bits as indicated by the corresponding information sequence of the range (i.e., the information sequence generated for $M_{Rep}$).

When M is larger than $M_{Rep}$, the selection may skip one or some bit positions that are forced to be frozen positions due to additional puncturing compared to $M_{Rep}$. The LUT may be significantly abbreviated due to partitioning M into ranges and storing only one information sequence per range, rather than storing an information sequence for every possible value of M.

Figure 17:
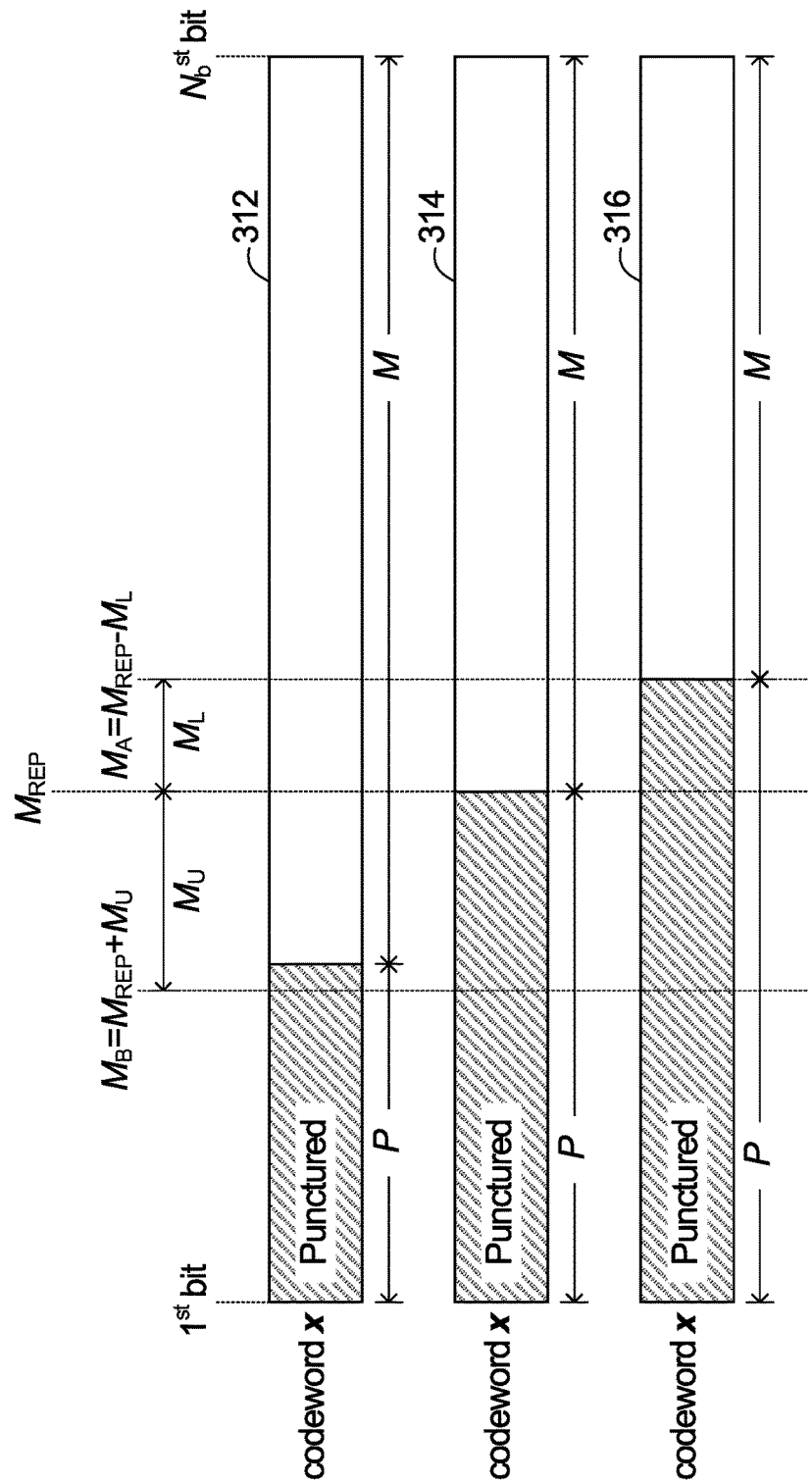
FIG. 17 shows three codewords illustrating the concept of piece-wise length matching according to one embodiment.

FIG. 17 illustrates three codewords 312, 314, and 316. The coding rate R at which codeword 312 is transmitted is such that M is slightly smaller than $M_B$. The coding rate R at which codeword 314 is transmitted is such that M equals $M_{Rep}$. The coding rate R at which codeword 316 is transmitted is such that M equals $M_A$. For each codeword, the number of bits to puncture (P=$N_b$-M) is different, but the same information sequence, corresponding to $M_{Rep}$, is used. In the example in FIG. 17, values $M_u$ and $M_L$ are illustrated, where $M_u$=$M_B$-$M_{Rep}$ and $M_L$=$M_{Rep}$-$M_A$. $M_u$ is the portion of the range between $M_{Rep}$ and $M_B$, and $M_L$ is the portion of the range between $M_A$ and $M_{Rep}$. $M_u$ is larger than $M_L$. Although it is not necessary for $M_u$ to be larger than $M_L$, in implementation $M_u$ may be considerably larger than $M_L$. Using a value of M that is less than $M_{Rep}$ requires more puncturing than $M_{Rep}$, which results in a higher coding rate with less information available for error detection and/or correction, which may result in decoding failure and further degrade the performance. Therefore, it may be desirable for $M_A$ to be closer to $M_{Rep}$, i.e. $M_L$ smaller than $M_u$, as illustrated in FIG. 17. However, using a value of M that is larger than $M_{Rep}$ does not result in additional puncturing compared to $M_{Rep}$, and so important coding information may be mostly kept with little loss. Therefore, $M_B$ may not need to be kept as close to $M_{Rep}$, i.e. $M_u$ may be larger than $M_L$, as illustrated in FIG. 17.

Figure 18:
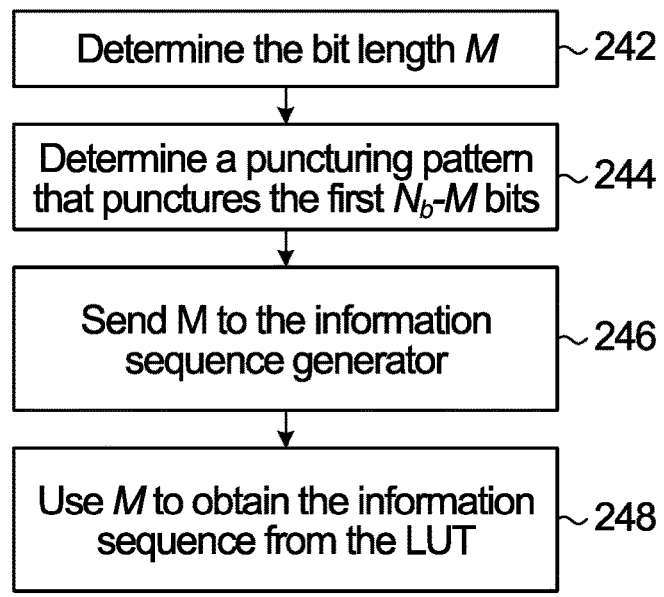
FIG. 18 is a flow chart of a method performed by the transmitter according to another embodiment.
Figure 20:
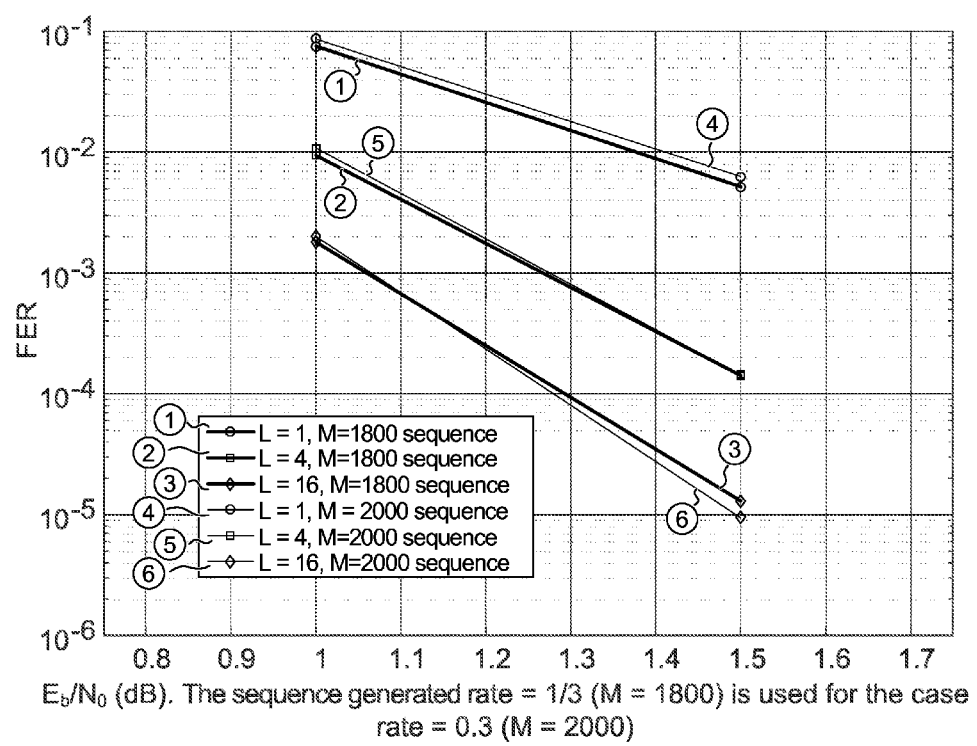
Figure 21:
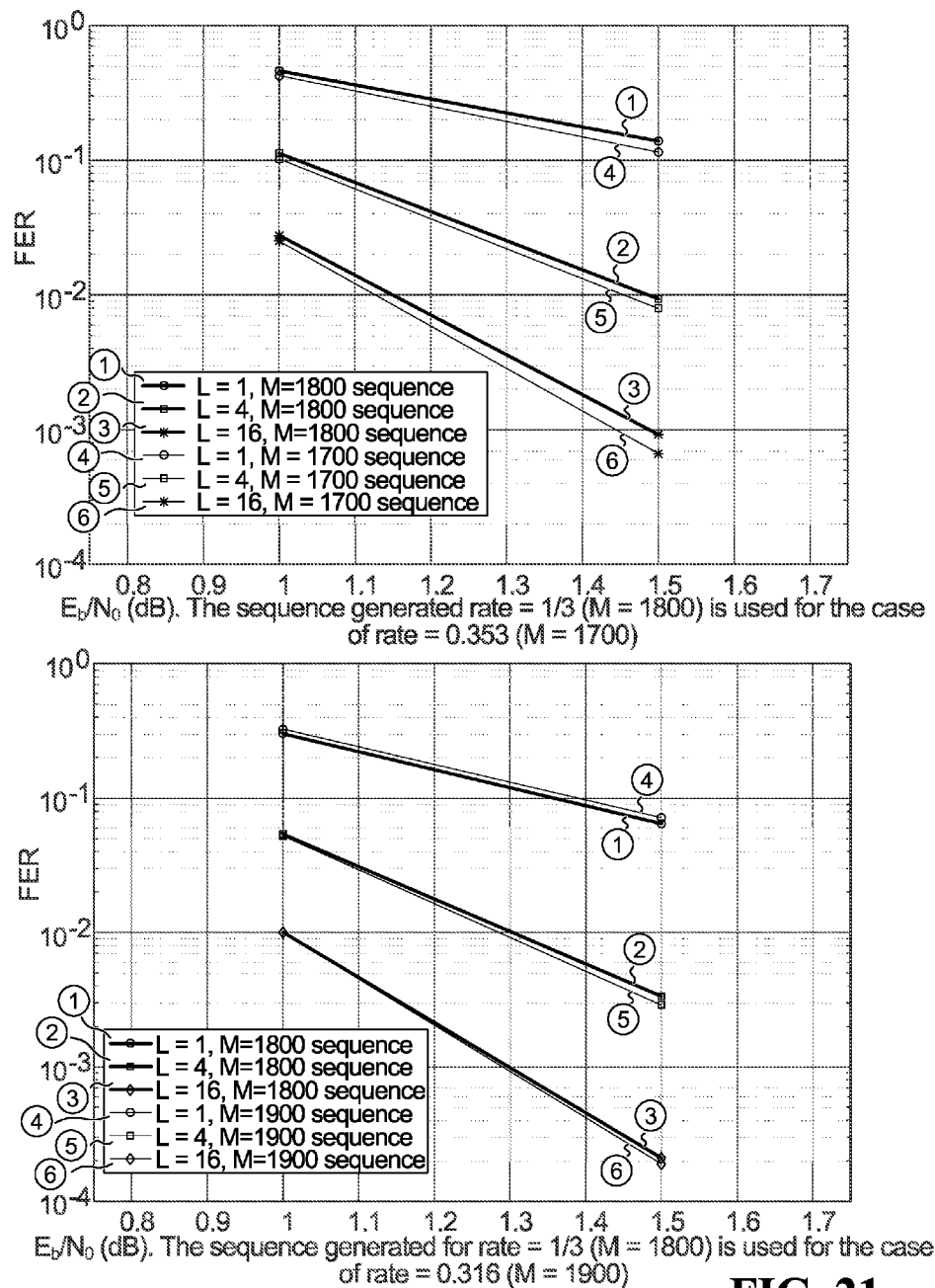
Figure 22:
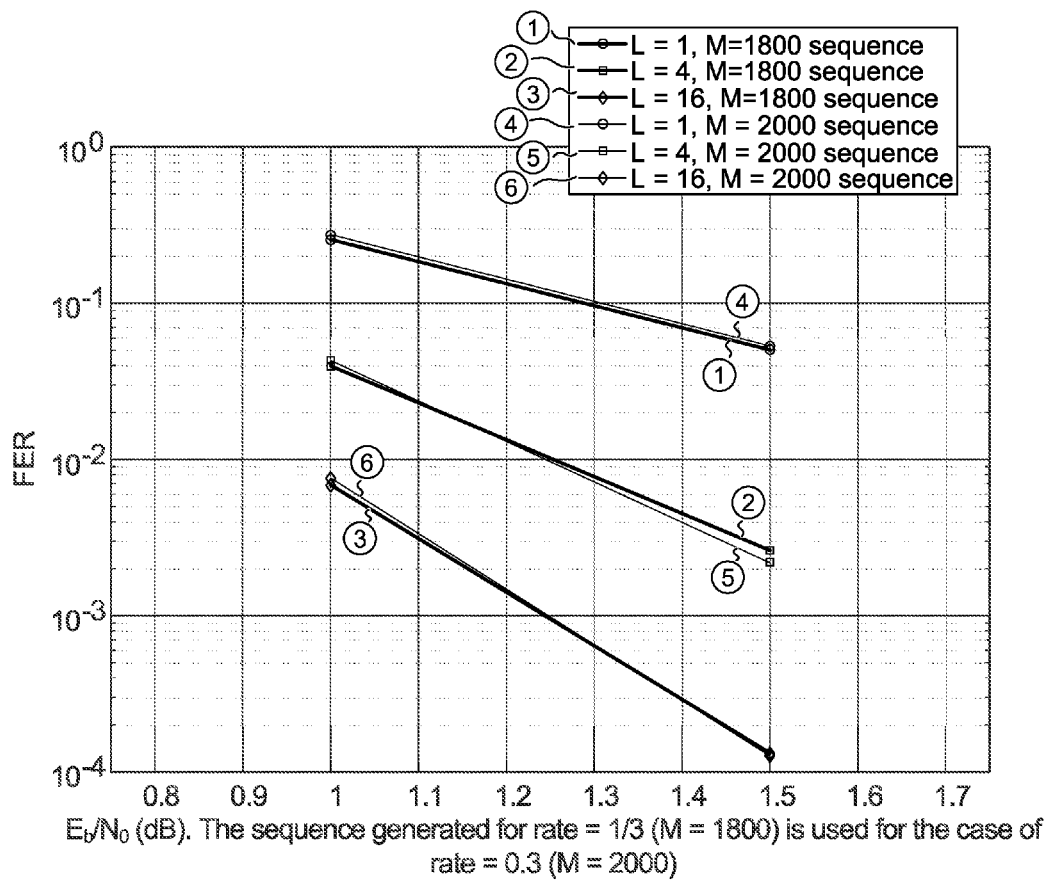

FIG. 18 is a flow chart of a method performed by the transmitter 124 according to one embodiment. In step 242, the transmitter 124 determines the bit length M that is to be transmitted over the channel 128. For example, the bit length M may be computed as M=$k_b$/R. In step 244, the transmitter 124 generates or determines the puncturing pattern 153 by constructing a puncturing pattern that punctures the first P=$N_b$-M bits of the codeword x. In step 246, the transmitter 142 then sends or otherwise makes available the value M to the information sequence generator 149. Alternatively, the information sequence generator 149 may independently compute the value of M. In step 248, the information sequence generator 149 generates the information sequence 155 by reading from the LUT 302 the information sequence 155 corresponding to the range containing the value of M. The method of FIG. 18 may be referred to as a piece-wise offline rate/length matching scheme because an information sequence used for a representative $M_{Rep}$ is also used for adjacent values of M contained in the designated range.

In step 244, puncturing the first P=$N_b$-M bits is only an example. Another set of P=$N_b$-M bits may be punctured (e.g. shortened) instead according to another puncturing pattern. The puncturing pattern in step 244 may include the shortening patterns that determine which subset of codeword bits to be shortened. In some embodiments, the puncturing pattern may be generated or determined considering other parameters in addition to M, e.g, the information block length K and/or coding rate R. For instance, for better error correction performance, puncturing the first $N_b$-M may be adopted for low and medium coding rates R, while block-based shortening or Bit Reversal (BIV) shortening may be used for high coding rates R. In other embodiments, the puncturing pattern may be determined by selecting a puncturing pattern (e.g. based on one or more of the above-noted parameters) from a plurality of available puncturing patterns. In some embodiments, determining a puncturing pattern includes determining the puncturing set, including the number and indices of the sub-channels to be punctured. Also, the piece-wise method described in relation to FIGS. 16 to 18 applies to both puncturing patterns that puncture consecutive bits in the codeword and puncturing patterns that do not puncture consecutive bits in the codeword.

In step 248, different LUTs may be used if different puncturing patterns are considered, e.g. each puncturing pattern corresponding to a respective LUT. Different LUTs may contain different numbers of ranges of M and the associated representative sequences. For example, in FIG. 16, if block-based shortening or BIV shortening are considered rather than puncturing the first few bits, the number of ranges of M may change with possibly different range boundaries (e.g., $M'_1 \leq M < M'_2$, $M'_2 \leq M < M'_3$, etc.). Moreover, for the same value of M, the LUT may contain a different representative sequence (e.g., for M that satisfies $M_1 \leq M < M_2$ and $M'_1 \leq M < M'_2$, Sequence #1 may be used in one LUT and Sequence #1' which is different from Sequence #1 may be used in another LUT). Furthermore, although in some embodiments the length of each of the stored sequences is $N_b$, in other embodiments the length of one, some, or all of the sequences may not be the mother code block length, i.e., power of 2. Instead, a sequence of length smaller than $N_b$, but no smaller than $M_2$ may be stored for the corresponding range of M, where $M_2$ is the upper boundary of the corresponding range of M.

In some embodiments, the different information sequences for the different ranges of M (e.g. Sequence #1, Sequence #2, . . . etc. in FIG. 16) may each correspond to the same mother code length $N_b$. In other embodiments, different information sequences for different ranges of M may correspond to different mother code lengths (e.g. each information sequence/range of M in FIG. 16 may correspond to a respective different mother code length).

The flow chart in FIG. 18 indicates that the selection of sequence, or the sequence generation, is dependent on the specific puncturing patterns as well as the transmitted code block length M.

Possible benefits associated with the method of FIG. 18 are as follows. By properly dividing the coding bit length space and choosing a representative block length $M_{Rep}$, one for each range, the performance of polar encoding/decoding may be comparable to that of a polar encoder that computes a different information sequence for each value of M. Offline generation is also possible, which may reduce implementation complexity because LUT 302 is being accessed during operation, rather than computing the information sequence during operation. The memory requirements may be reduced because an information sequence is being stored for each range of block length values, rather than for every possible block length value M. The method of FIG. 18 is applicable to encoders that use only binary polar codes, e.g. the Arikan polar code, as well as to encoders that use non-binary general polar codes, e.g. RS based polar codes.

Embodiments above describe generating or choosing the information sequence 155 based on which range the value M falls within, e.g. via LUT 302. Alternatively, the range may be based on the coding rate R instead. That is, different ranges of values for the coding rate R may each have a representative coding rate $R_{Rep}$. The information sequence corresponding to $R_{Rep}$ may be used whenever the coding rate falls within the range represented by $R_{Rep}$. Also, in alternative embodiments, an information sequence of the mother code block length may be pre-fixed, according to which a common puncturing set is generated or determined for a range of code block lengths M or the coding rates R.

FIGS. 19 to 22 illustrate different FER curves. $N_b$=2048 bits and $k_b$=600 bits. The representative coding rate $R_{Rep}$=⅓, and therefore $$M_{Rep} = \frac{k_b}{R_{Rep}} = 1800 \text{ bits}.$$

SCL decoding was performed using a list size L. RS(4) polar codes were used in the simulations corresponding to FIGS. 19 and 20, and binary polar codes were used in the simulations corresponding to FIGS. 21 and 22. The FER for different list sizes L and values of M are plotted. As may be seen from FIG. 19, the FER changes more, relative to $M_{Rep}$=1800 bits, when using a value of M that is 100 bits less than $M_{Rep}$ compared to using a value of M that is 100 bits more than $M_{Rep}$.

Figure 23:
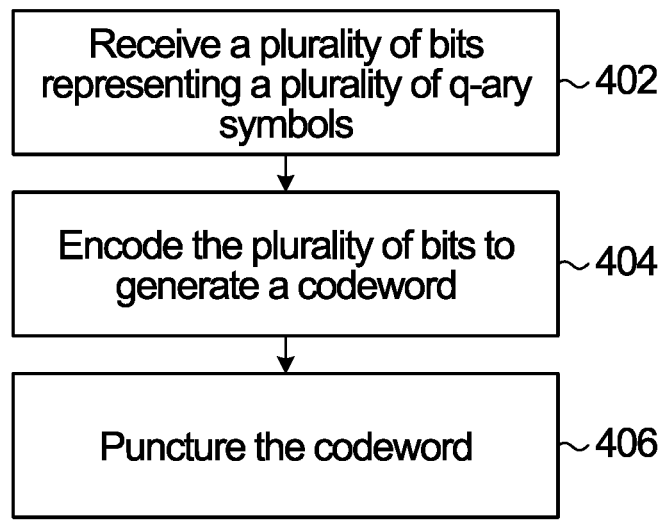
FIG. 23 is a flow chart of a method performed by a transmitter according to another embodiment.

FIG. 23 is a flow chart of a method performed by a transmitter, e.g. transmitter 124, according to one embodiment. In step 402, a plurality of bits are received at a polar encoder of the transmitter. The plurality of bits represent a plurality of q-ary symbols, where q>2.

In step 404, the plurality of bits are encoded using the polar encoder to generate a codeword of q-ary symbols represented by bits.

In some embodiments, encoding the plurality of bits includes encoding the plurality of bits using at least one polar encoder kernel to generate the codeword. The encoding may include: receiving, at the polar encoder kernel, a set of input q-ary symbols represented by bits; and transforming the set of input q-ary symbols, according to a seed matrix of the polar encoder kernel, to produce a set of output q-ary symbols represented by bits.

In some embodiments, encoding the plurality of bits may include: (1) mapping the plurality of q-ary symbols to a subset of positions of an input vector according to an information sequence; (2) setting remaining positions of the input vector as frozen values that are known by a decoder; and then (3) encoding the input vector in the polar encoder.

In step 406, the codeword is punctured according to a puncturing pattern to obtain a punctured codeword having a reduced bit length.

In some embodiments, the puncturing pattern may be generated based on the information sequence. In other embodiments, the information sequence may be generated based on the puncturing pattern. In other embodiments, both the information sequence and the puncturing pattern may be jointly generated.

In some embodiments, the information sequence may be obtained by: (1) obtaining a value corresponding to at least one of: a coding rate R to be used to transmit the plurality of bits, and a length M of the punctured codeword; (2) determining which range of values the value falls within; and then (3) obtaining an information sequence corresponding to the range the value falls within. In some embodiments, obtaining the information sequence corresponding to the range the value falls within includes: retrieving from memory a stored information sequence corresponding to the range. In some embodiments, the information sequence corresponding to the range is an information sequence determined based on a representative value in the range.

In some embodiments, the codeword has bit length $N_b$, the punctured codeword has bit length M, and the puncturing pattern is to puncture the first ($N_b$–M) bits of the codeword.

Figure 24:
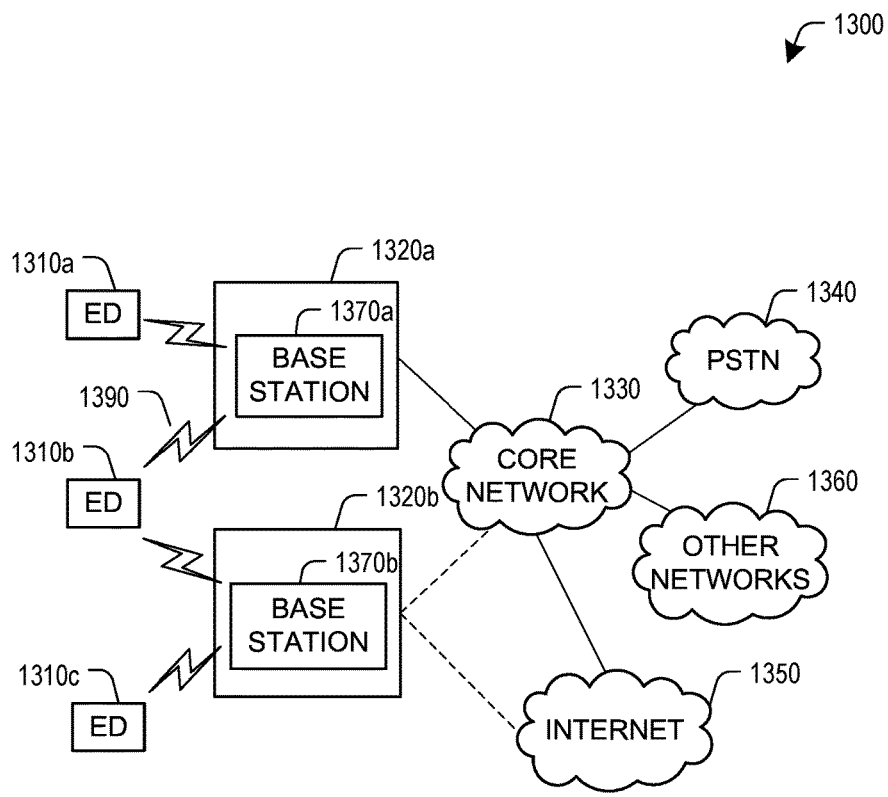
FIG. 24 illustrates an example communication system.

FIG. 24 illustrates an example communication system 1300 in which embodiments of the present disclosure could be implemented. In general, the system 1300 enables multiple wireless or wired elements to communicate data and other content. The purpose of the system 1300 may be to provide content (voice, data, video, text) via broadcast, narrowcast, user device to user device, etc. The system 1300 may operate efficiently by sharing resources such as bandwidth.

In this example, the communication system 1300 includes electronic devices (ED) 1310a-1310c, radio access networks (RANs) 1320a-1320b, a core network 1330, a public switched telephone network (PSTN) 1340, the Internet 1350, and other networks 1360. While certain numbers of these components or elements are shown in FIG. 24, any reasonable number of these components or elements may be included in the system 1300.

The EDs 1310a-1310c and base stations 1370a-1370b are examples of communication equipment that can be configured to implement some or all of the functionality and/or embodiments described herein. For example, any one of the EDs 1310a-1310c and base stations 1370a-1370b could be configured to implement the encoding or decoding functionality (or both) described above. In another example, any one of the EDs 1310a-1310c and base stations 1370a-1370b could include the transmitter 124, the receiver 126, or both described above.

The EDs 1310a-1310c are configured to operate, communicate, or both, in the system 1300. For example, the EDs 1310a-1310c are configured to transmit, receive, or both via wireless or wired communication channels. Each ED 1310a-1310c represents any suitable end user device for wireless operation and may include such devices (or may be referred to) as a user equipment/device (UE), wireless transmit/receive unit (WTRU), mobile station, fixed or mobile subscriber unit, cellular telephone, station (STA), machine type communication device (MTC), personal digital assistant (PDA), smartphone, laptop, computer, touchpad, wireless sensor, or consumer electronics device.

In FIG. 24, the RANs 1320a-1320b include base stations 1370a-1370b, respectively. Each base station 1370a-1370b is configured to wirelessly interface with one or more of the EDs 1310a-1310c to enable access to any other base station 1370a-1370b, the core network 1330, the PSTN 1340, the Internet 1350, and/or the other networks 1360. For example, the base stations 1370a-1370b may include (or be) one or more of several well-known devices, such as a base transceiver station (BTS), a Node-B (NodeB), an evolved NodeB (eNodeB), a Home eNodeB, a gNodeB (sometimes called a "gigabit" NodeB), a transmission point (TP), a site controller, an access point (AP), or a wireless router. Any ED 1310a-1310c may be alternatively or jointly configured to interface, access, or communicate with any other base station 1370a-1370b, the internet 1350, the core network 1330, the PSTN 1340, the other networks 1360, or any combination of the preceding. Optionally, the system may include RANs, such as RAN 1320b, wherein the corresponding base station 1370b accesses the core network 1330 via the internet 1350, as shown.

In the embodiment shown in FIG. 24, the base station 1370a forms part of the RAN 1320a, which may include other base stations, base station controller(s) (BSC), radio network controller(s) (RNC), relay nodes, elements, and/or devices. Any base station 1370a, 1370b may be a single element, as shown, or multiple elements, distributed in the corresponding RAN, or otherwise. Also, the base station 1370b forms part of the RAN 1320b, which may include other base stations, elements, and/or devices. Each base station 1370a-1370b may be configured to operate to transmit and/or receive wireless signals within a particular geographic region or area, sometimes referred to as a "cell." A cell may be further divided into cell sectors, and a base station 1370a-1370b may, for example, employ multiple transceivers to provide service to multiple sectors. In some embodiments a base station 1370a-1370b may establish pico or femto cells where the radio access technology supports such. In some embodiments, multiple-input multiple-output (MIMO) technology may be employed having multiple transceivers for each cell. The number of RAN 1320a-1320b shown is exemplary only. Any number of RAN may be contemplated when devising the system 1300.

The base stations 1370a-1370b communicate with one or more of the EDs 1310a-1310c over one or more air interfaces 1390 using wireless communication links e g RF, μWave, IR, etc. The air interfaces 1390 may utilize any suitable radio access technology. For example, the system 1300 may implement one or more channel access methods, such as code division multiple access (CDMA), time division multiple access (TDMA), frequency division multiple access (FDMA), orthogonal FDMA (OFDMA), or single-carrier FDMA (SC-FDMA) in the air interfaces 1390.

A base station 1370a-1370b may implement Universal Mobile Telecommunication System (UMTS) Terrestrial Radio Access (UTRA) to establish an air interface 1390 using wideband CDMA (WCDMA). In doing so, the base station 1370a-1370b may implement protocols such as HSPA, HSPA+ optionally including HSDPA, HSUPA or both. Alternatively, a base station 1370a-1370b may establish an air interface 1390 with Evolved UTMS Terrestrial Radio Access (E-UTRA) using LTE, LTE-A, and/or LTE-B. It is contemplated that the system 1300 may use multiple channel access functionality, including such schemes as described above. Other radio technologies for implementing air interfaces Include IEEE 802.11, 802.15, 802.16, CDMA2000, CDMA2000 1x, CDMA2000 EV-DO, IS-2000, IS-95, IS-856, GSM, EDGE, and GERAN. Of course, other multiple access schemes and wireless protocols may be utilized.

The RANs 1320a-1320b are in communication with the core network 1330 to provide the EDs 1310a-1310c with various services such as voice, data, and other services. Understandably, the RANs 1320a-1320b and/or the core network 1330 may be in direct or indirect communication with one or more other RANs (not shown), which may or may not be directly served by core network 1330, and may or may not employ the same radio access technology as RAN 1320a, RAN 1320b or both. The core network 1330 may also serve as a gateway access between (i) the RANs 1320a-1320b or EDs 1310a-1310c or both, and (ii) other networks (such as the PSTN 1340, the Internet 1350, and the other networks 1360). In addition, some or all of the EDs 1310a-1310c may include functionality for communicating with different wireless networks over different wireless links using different wireless technologies and/or protocols. Instead of wireless communication (or in addition thereto), the EDs 1310a-1310c may communicate via wired communication channels to a service provider or switch (not shown), and to the internet 1350. PSTN 1340 may include circuit switched telephone networks for providing plain old telephone service (POTS). Internet 1350 may include a network of computers and subnets (intranets) or both, and incorporate protocols, such as IP, TCP, UDP. EDs 1310a-1310c may be multimode devices capable of operation according to multiple radio access technologies, and incorporate multiple transceivers necessary to support such.

Figure 25:
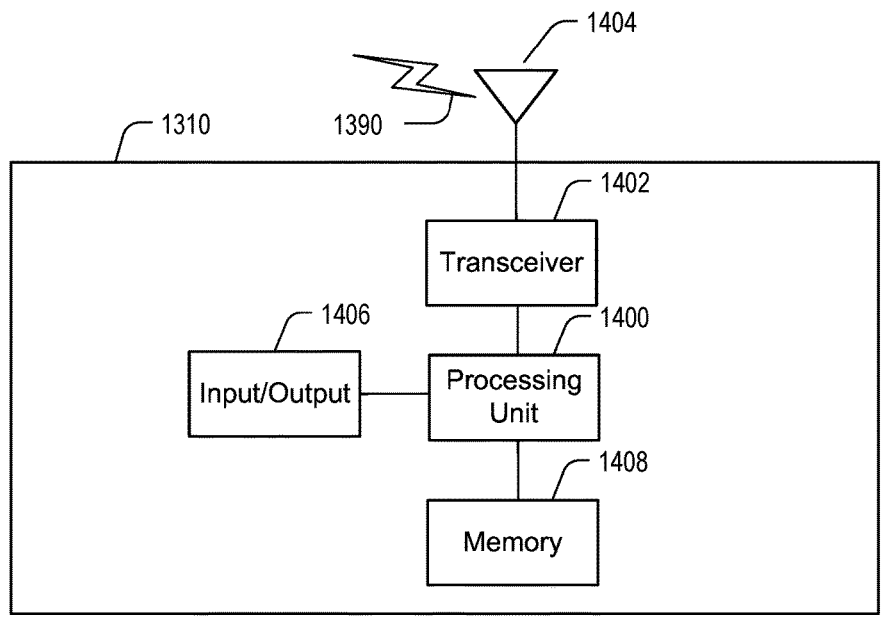
FIGS. 25 and 26 illustrate example devices that may implement the functionality and/or embodiments described herein.
Figure 26:
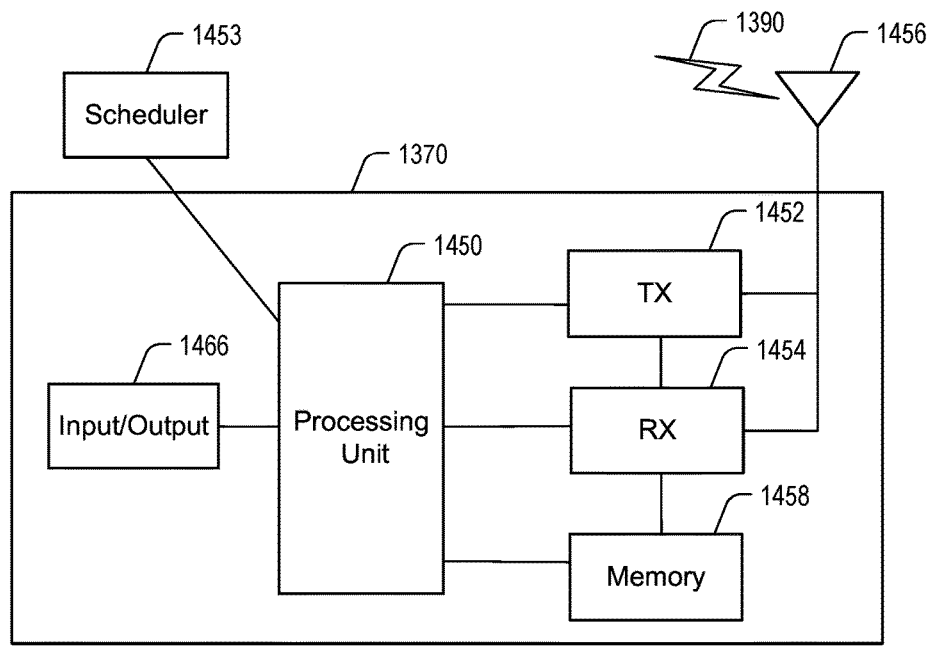

FIGS. 25 and 26 illustrate example devices that may implement the functionality and/or embodiments described above. In particular, FIG. 25 illustrates an example ED 1310, and FIG. 26 illustrates an example base station 1370. These components could be used in the system 1300 or in any other suitable system.

As shown in FIG. 25, the ED 1310 includes at least one processing unit 1400. The processing unit 1400 implements various processing operations of the ED 1310. For example, the processing unit 1400 could perform signal coding, data processing, power control, input/output processing, or any other functionality enabling the ED 1310 to operate in the system 1300. The processing unit 1400 may also be configured to implement some or all of the functionality and/or embodiments described above. Each processing unit 1400 includes any suitable processing or computing device configured to perform one or more operations. Each processing unit 1400 could, for example, include a microprocessor, microcontroller, digital signal processor, field programmable gate array, or application specific integrated circuit.

The ED 1310 also includes at least one transceiver 1402. The transceiver 1402 is configured to modulate data or other content for transmission by at least one antenna or NIC (Network Interface Controller) 1404. The transceiver 1402 is also configured to demodulate data or other content received by the at least one antenna 1404. Each transceiver 1402 includes any suitable structure for generating signals for wireless or wired transmission and/or processing signals received wirelessly or by wire. Each antenna 1404 includes any suitable structure for transmitting and/or receiving wireless or wired signals. One or multiple transceivers 1402 could be used in the ED 1310, and one or multiple antennas 1404 could be used in the ED 1310. Although shown as a single functional unit, a transceiver 1402 could also be implemented using at least one transmitter and at least one separate receiver. In some embodiments, the transceiver 1402 may implement transmitter 124 and/or receiver 126 described earlier.

The ED 1310 further includes one or more input/output devices 1406 or interfaces (such as a wired interface to the internet 1350). The input/output devices 1406 facilitate interaction with a user or other devices (network communications) in the network. Each input/output device 1406 includes any suitable structure for providing information to or receiving/providing information from a user, such as a speaker, microphone, keypad, keyboard, display, or touch screen, including network interface communications.

In addition, the ED 1310 includes at least one memory 1408. The memory 1408 stores instructions and data used, generated, or collected by the ED 1310. For example, the memory 1408 could store software instructions or modules configured to implement some or all of the functionality and/or embodiments described above and that are executed by the processing unit(s) 1400. Each memory 1408 includes any suitable volatile and/or non-volatile storage and retrieval device(s). Any suitable type of memory may be used, such as random access memory (RAM), read only memory (ROM), hard disk, optical disc, subscriber identity module (SIM) card, memory stick, secure digital (SD) memory card, and the like.

As shown in FIG. 26, the base station 1370 includes at least one processing unit 1450, at least one transmitter 1452 (which may or may not be the same as transmitter 124 described earlier), at least one receiver 1454 (which may or may not be the same as receiver 126 described earlier), one or more antennas 1456, at least one memory 1458, and one or more input/output devices or interfaces 1466. A transceiver, not shown, may be used instead of the transmitter 1452 and receiver 1454. A scheduler 1453 may be coupled to the processing unit 1450. The scheduler 1453 may be included within or operated separately from the base station 1370. The processing unit 1450 implements various processing operations of the base station 1370, such as signal coding, data processing, power control, input/output processing, or any other functionality. The processing unit 1450 can also be configured to implement some or all of the functionality and/or embodiments described in more detail above. Each processing unit 1450 includes any suitable processing or computing device configured to perform one or more operations. Each processing unit 1450 could, for example, include a microprocessor, microcontroller, digital signal processor, field programmable gate array, or application specific integrated circuit.

Each transmitter 1452 includes any suitable structure for generating signals for wireless or wired transmission to one or more EDs or other devices. Each receiver 1454 includes any suitable structure for processing signals received wirelessly or by wire from one or more EDs or other devices. Although shown as separate components, at least one transmitter 1452 and at least one receiver 1454 could be combined into a transceiver. Each antenna 1456 includes any suitable structure for transmitting and/or receiving wireless or wired signals. While a common antenna 1456 is shown here as being coupled to both the transmitter 1452 and the receiver 1454, one or more antennas 1456 could be coupled to the transmitter(s) 1452, and one or more separate antennas 1456 could be coupled to the receiver(s) 1454. Each memory 1458 includes any suitable volatile and/or non-volatile storage and retrieval device(s) such as those described above in connection to the ED 1310. The memory 1458 stores instructions and data used, generated, or collected by the base station 1370. For example, the memory 1458 could store software instructions or modules configured to implement some or all of the functionality and/or embodiments described above and that are executed by the processing unit(s) 1450.

Each input/output device 1466 facilitates interaction with a user or other devices (network communications) in the network. Each input/output device 1466 includes any suitable structure for providing information to or receiving/providing information from a user, including network interface communications.

Although the present invention has been described with reference to specific features and embodiments thereof, various modifications and combinations can be made thereto without departing from the invention. The description and drawings are, accordingly, to be regarded simply as an illustration of some embodiments of the invention as defined by the appended claims, and are contemplated to cover any and all modifications, variations, combinations or equivalents that fall within the scope of the present invention. Therefore, although the present invention and its advantages have been described in detail, various changes, substitutions and alterations can be made herein without departing from the invention as defined by the appended claims. Moreover, the scope of the present application is not intended to be limited to the particular embodiments of the process, machine, manufacture, composition of matter, means, methods and steps described in the specification. As one of ordinary skill in the art will readily appreciate from the disclosure of the present invention, processes, machines, manufacture, compositions of matter, means, methods, or steps, presently existing or later to be developed, that perform substantially the same function or achieve substantially the same result as the corresponding embodiments described herein may be utilized according to the present invention. Accordingly, the appended claims are intended to include within their scope such processes, machines, manufacture, compositions of matter, means, methods, or steps.

Moreover, any module, component, or device exemplified herein that executes instructions may include or otherwise have access to a non-transitory computer/processor readable storage medium or media for storage of information, such as computer/processor readable instructions, data structures, program modules, and/or other data. A non-exhaustive list of examples of non-transitory computer/processor readable storage media includes magnetic cassettes, magnetic tape, magnetic disk storage or other magnetic storage devices, optical disks such as compact disc read-only memory (CD-ROM), digital video discs or digital versatile disc (DVDs), Blu-ray Disc™, or other optical storage, volatile and non-volatile, removable and non-removable media implemented in any method or technology, random-access memory (RAM), read-only memory (ROM), electrically erasable programmable read-only memory (EEPROM), flash memory or other memory technology. Any such non-transitory computer/processor storage media may be part of a device or accessible or connectable thereto. Any application or module herein described may be implemented using computer/processor readable/executable instructions that may be stored or otherwise held by such non-transitory computer/processor readable storage media.

The invention claimed is:

1. A method performed at a transmitter comprising:
receiving a plurality of bits at a polar encoder, the plurality of bits representing a plurality of q-ary symbols, where q>2;
retrieving from memory a stored information sequence, wherein the information sequence has particular positions as frozen positions based on a puncturing pattern that punctures the first ($N_b$–M) bits of a codeword;
mapping the plurality of q-ary symbols to a subset of positions of an input vector according to the information sequence;
encoding the input vector using the polar encoder to generate the codeword of q-ary symbols represented by bits, wherein the codeword has bit length $N_b$;
puncturing the codeword according to the puncturing pattern to obtain a punctured codeword having a reduced bit length, wherein the punctured codeword has bit length M;
transmitting the M bits to result in transmission of the punctured codeword;
the method further comprising obtaining the information sequence by:
obtaining a value corresponding to at least one of: a coding rate R to be used to transmit the plurality of bits, and the bit length M of the punctured codeword;
determining which range of values the value falls within; and
obtaining an information sequence corresponding to the range the value falls within, wherein obtaining the information sequence corresponding to the range the value falls within comprises: retrieving from memory a stored information sequence corresponding to the range.

2. The method of claim 1, wherein encoding the input vector comprises:

encoding the input vector using at least one polar encoder kernel to generate the codeword, the encoding including:

receiving, at the polar encoder kernel, a set of input q-ary symbols represented by bits; and transforming the set of input q-ary symbols, according to a seed matrix of the polar encoder kernel, to produce a set of output q-ary symbols represented by bits.

3. The method of claim 1, further comprising generating the information sequence based on the puncturing pattern.

4. The method of claim 1, further comprising jointly generating both the information sequence and the puncturing pattern.

5. The method of claim 1, wherein the information sequence corresponding to the range is an information sequence determined based on a representative value in the range.

6. The method of claim 1, wherein puncturing the codeword according to the puncturing pattern comprises shortening the codeword.

7. A transmitter comprising:

a memory to store an information sequence, wherein the information sequence has particular positions as frozen positions based on a puncturing pattern that punctures the first ($N_b$–M) bits of a codeword;

a polar encoder to receive a plurality of bits, the plurality of bits representing a plurality of q-ary symbols, where q>2, to map the plurality of q-ary symbols to a subset of positions of an input vector according to the information sequence, and to encode the input vector to generate the codeword of q-ary symbols represented by bits, wherein the codeword has bit length $N_b$; and a puncturer to puncture the codeword according to the puncturing pattern to obtain a punctured codeword having a reduced bit length, wherein the punctured codeword has bit length M;

the transmitter to transmit the M bits to result in transmission of the punctured codeword;

wherein the transmitter is to obtain the information sequence by:

obtaining a value corresponding to at least one of: a coding rate R to be used to transmit the plurality of bits, and the bit length M of the punctured codeword;

determining which range of values the value falls within; and obtaining an information sequence corresponding to the range the value falls within;

wherein the transmitter is to obtain the information sequence corresponding to the range the value falls within by: retrieving from the memory a stored information sequence corresponding to the range.

8. The transmitter of claim 7, wherein the polar encoder is to encode the input vector using at least one polar encoder kernel to generate the codeword, and wherein the polar encoder is to encode the input vector by:

receiving, at the polar encoder kernel, a set of input q-ary symbols represented by bits; and transforming the set of input q-ary symbols, according to a seed matrix of the polar encoder kernel, to produce a set of output q-ary symbols represented by bits.

9. The transmitter of claim 7, wherein the transmitter is to generate the information sequence based on the puncturing pattern.

10. The transmitter of claim 7, wherein the transmitter is to jointly generate both the information sequence and the puncturing pattern.

11. The transmitter of claim 7, wherein the information sequence corresponding to the range is an information sequence determined based on a representative value in the range.

12. The transmitter of claim 7, wherein the puncturer is to puncture the codeword by shortening the codeword.

* * * * *